(12) United States Patent
Muraoka et al.

(10) Patent No.: US 7,826,247 B2
(45) Date of Patent: *Nov. 2, 2010

(54) METHOD FOR INITIALIZING RESISTANCE-VARIABLE MATERIAL, MEMORY DEVICE CONTAINING A RESISTANCE-VARIABLE MATERIAL, AND METHOD FOR INITIALIZING NONVOLATILE MEMORY CIRCUIT INCLUDING VARIABLE RESISTOR

(75) Inventors: Shunsaku Muraoka, Osaka (JP); Koichi Osano, Osaka (JP); Ken Takahashi, Osaka (JP); Masafumi Shimotashiro, Osaka (JP)

(73) Assignee: Panasonic Corporation, Osaka (JP)

( * ) Notice: Subject to any disclaimer, the term of this patent is extended or adjusted under 35 U.S.C. 154(b) by 159 days.

This patent is subject to a terminal disclaimer.

(21) Appl. No.: 12/078,385

(22) Filed: Mar. 31, 2008

(65) Prior Publication Data
US 2008/0259678 A1 Oct. 23, 2008

Related U.S. Application Data

(62) Division of application No. 10/583,518, filed as application No. PCT/JP2004/019291 on Dec. 16, 2004, now Pat. No. 7,369,431.

(30) Foreign Application Priority Data

Dec. 18, 2003 (JP) .............................. 2003-421374
Dec. 26, 2003 (JP) .............................. 2003-435501

(51) Int. Cl.
G11C 11/00 (2006.01)
(52) U.S. Cl. ........................ 365/148; 365/154; 365/158; 365/163

(58) Field of Classification Search ................. 365/148, 365/154, 158, 163
See application file for complete search history.

(56) References Cited

U.S. PATENT DOCUMENTS 5,337,279 A     8/1994    Gregory et al.
6,204,139 B1 *   3/2001    Liu et al. ..................... 438/385

(Continued)

FOREIGN PATENT DOCUMENTS

CN            1346155 A      4/2002

(Continued)

OTHER PUBLICATIONS

Liu S Q, et al., "Electric-pulse-induced reversible resistance change effect in magnetoresistive films," Applied Physics Letters, May 8, 2000, pp. 2749-2751, American Institute of Physics, New York.

(Continued)

*Primary Examiner*—Viet Q Nguyen
(74) *Attorney, Agent, or Firm*—McDermott Will & Emery LLP

(57) ABSTRACT

An initialization method of the present invention is a method for initializing a material (variable-resistance material) (2) whose resistance value increases/decreases according to the polarity of an applied electric pulse. An electric pulse having a first polarity is applied at least once between first and second electrodes (1, 3) connected to the variable-resistance material (2) such that the potential of the first electrode is higher than that of the second electrode.

9 Claims, 34 Drawing Sheets

U.S. PATENT DOCUMENTS

| | | | |
|---|---|---|---|
| 6,473,332 B1* | 10/2002 | Ignatiev et al. | 365/148 |
| 6,538,297 B2 | 3/2003 | Odagawa et al. | |
| 6,815,744 B1 | 11/2004 | Beck et al. | |
| 6,844,564 B2 | 1/2005 | Tanaka et al. | |
| 6,930,909 B2* | 8/2005 | Moore et al. | 365/148 |
| 6,965,137 B2* | 11/2005 | Kinney et al. | 257/295 |
| 6,998,698 B2* | 2/2006 | Inoue et al. | 257/539 |
| 7,291,857 B2 | 11/2007 | Tanaka et al. | |
| 7,369,431 B2* | 5/2008 | Muraoka et al. | 365/163 |
| 7,463,506 B2* | 12/2008 | Muraoka et al. | 365/148 |
| 2003/0003674 A1* | 1/2003 | Hsu et al. | 438/385 |
| 2009/0048643 A1* | 2/2009 | Erickson et al. | 607/59 |

FOREIGN PATENT DOCUMENTS

| | | |
|---|---|---|
| EP | 1 418 592 A | 5/2004 |
| JP | 2002-537627 A | 11/2002 |
| WO | WO 03/050872 A1 | 6/2003 |

OTHER PUBLICATIONS

Rozenberg M J, et al., "Nonvolatile memory with multilevel switching: A basic model," Physical Review Letters, Apr. 30, 2004, pp. 178302-1-178302-4, vol. 92, No. 17.

Chinese Office Action, with English translation, issued in Chinese Patent Application No. 2004800374964, mailed Mar. 27, 2009.

European Search Report issued in European Patent Application No. 04 807 648.3-2210, mailed Aug. 4, 2010.

* cited by examiner

FIG. 18
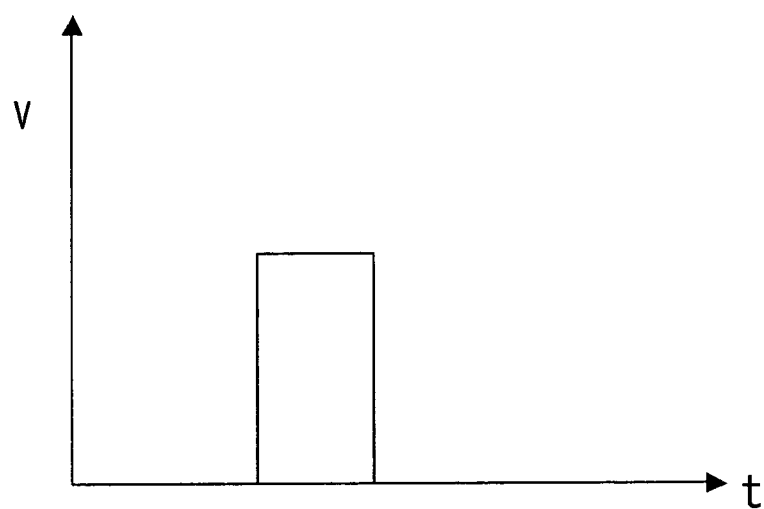
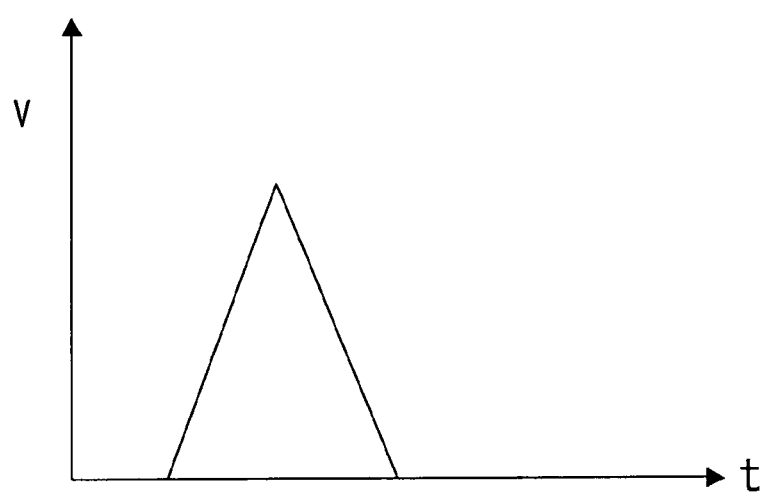
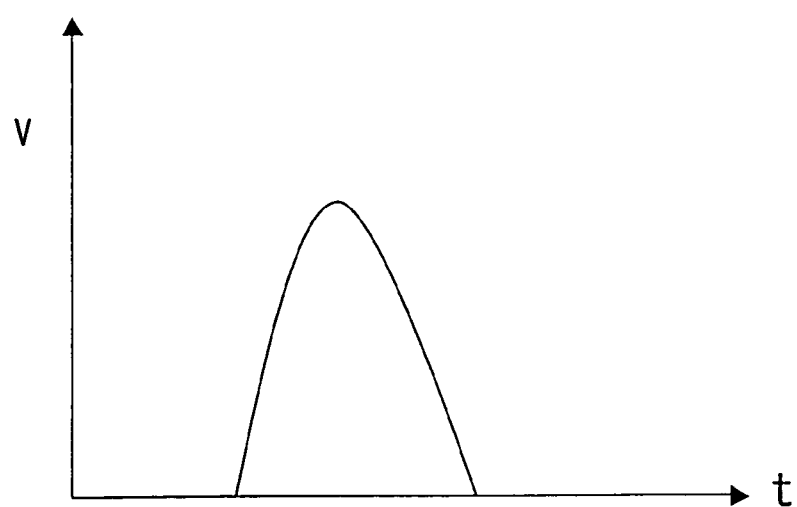

FIG. 29
(a)
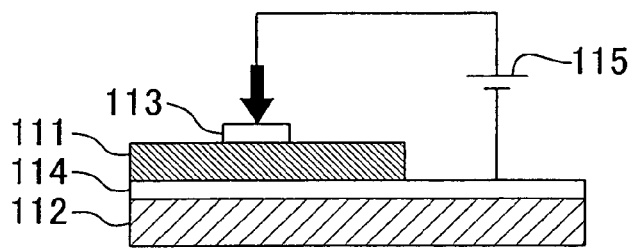
(b)
Symbol of variable resistor | Symbols after initialization
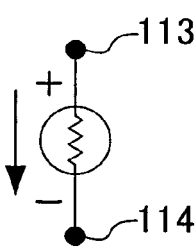 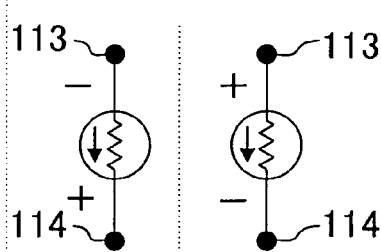
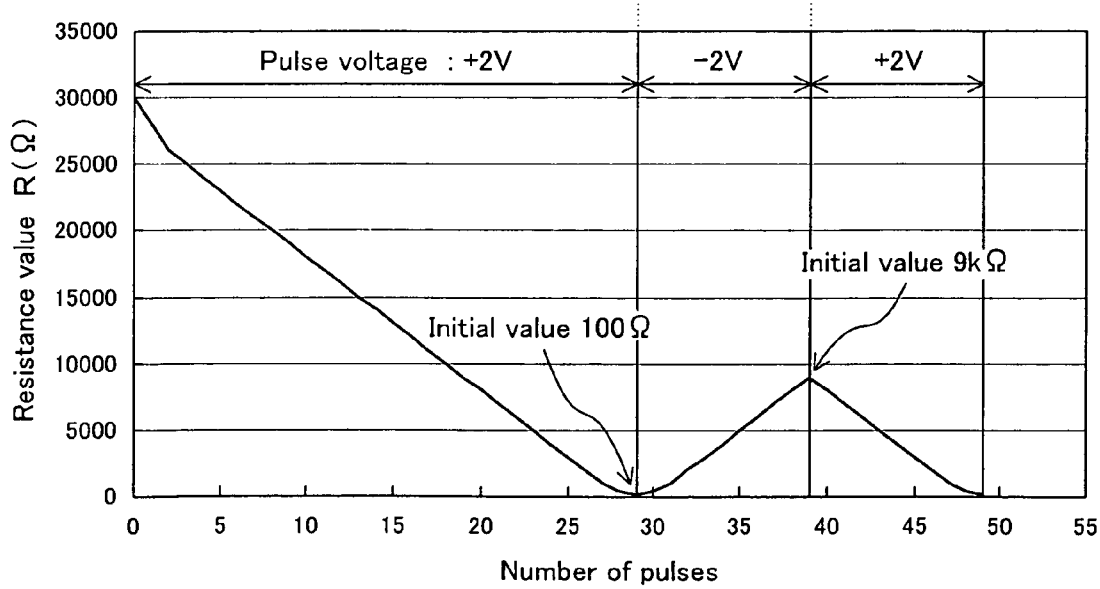

FIG. 30
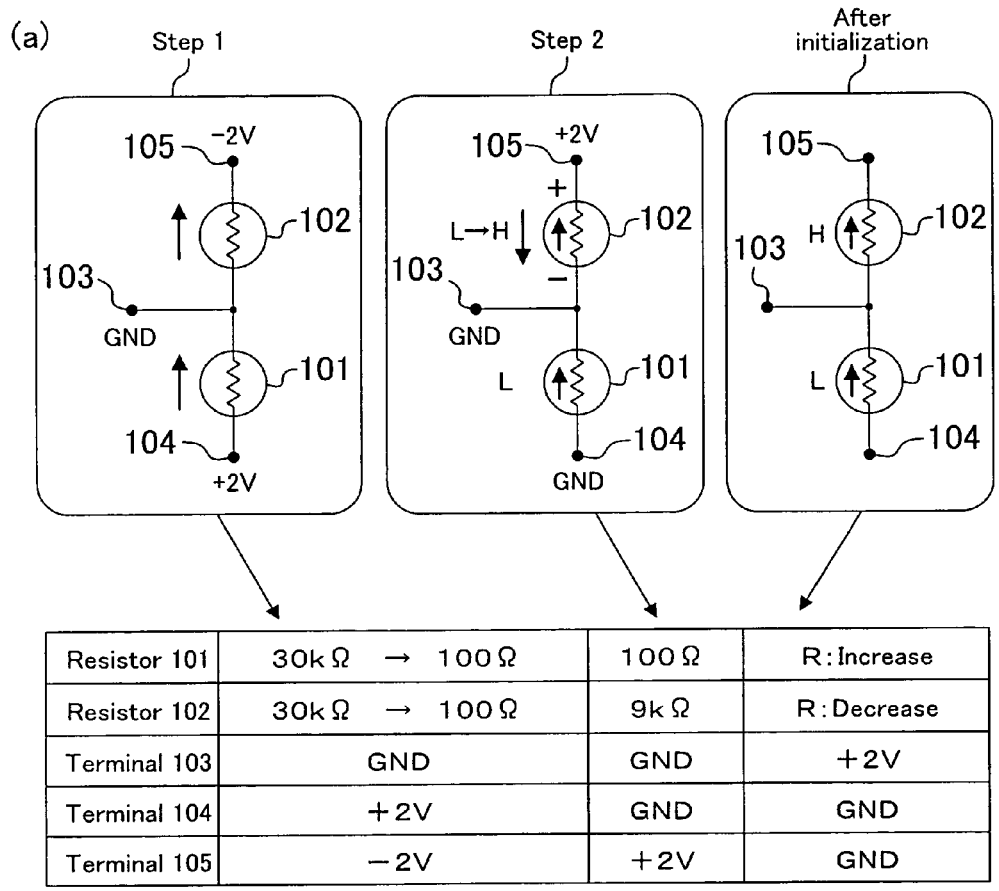
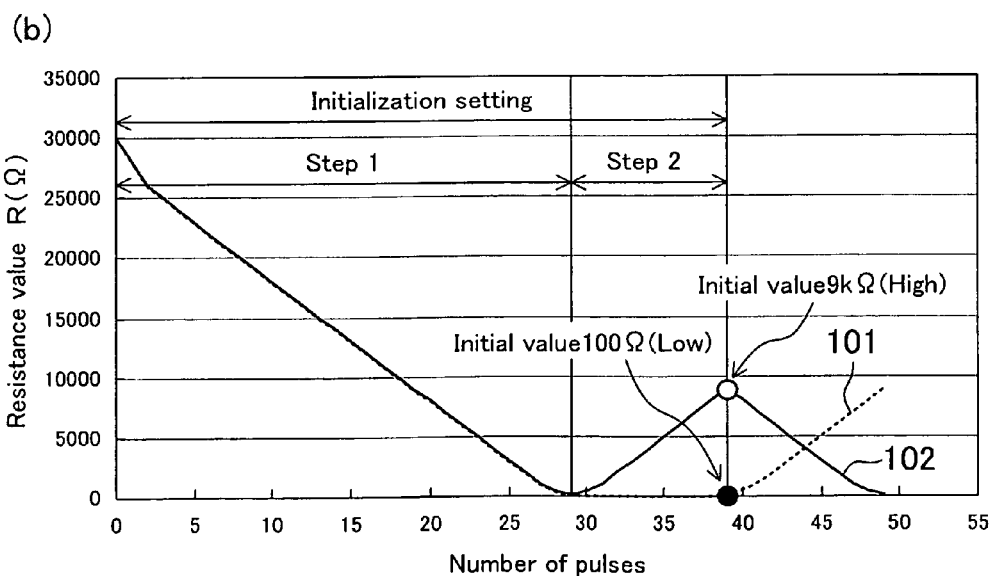

FIG. 31
(a)
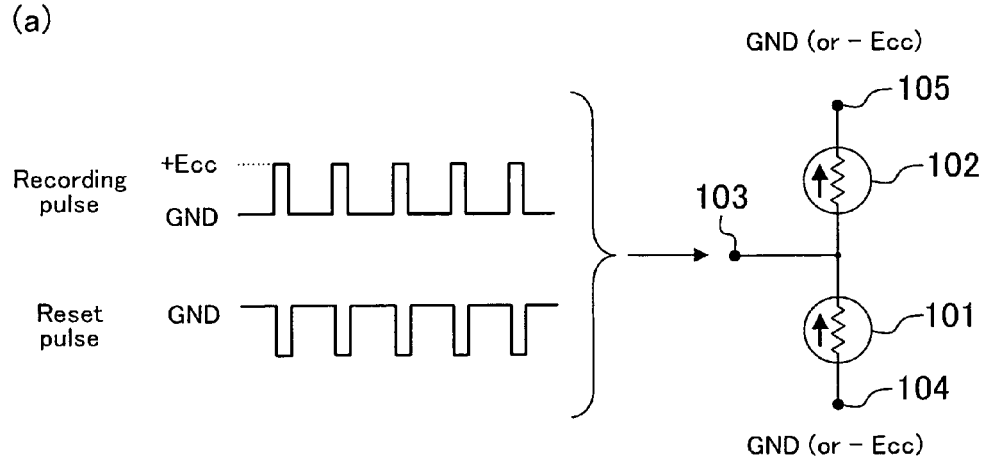
(b)
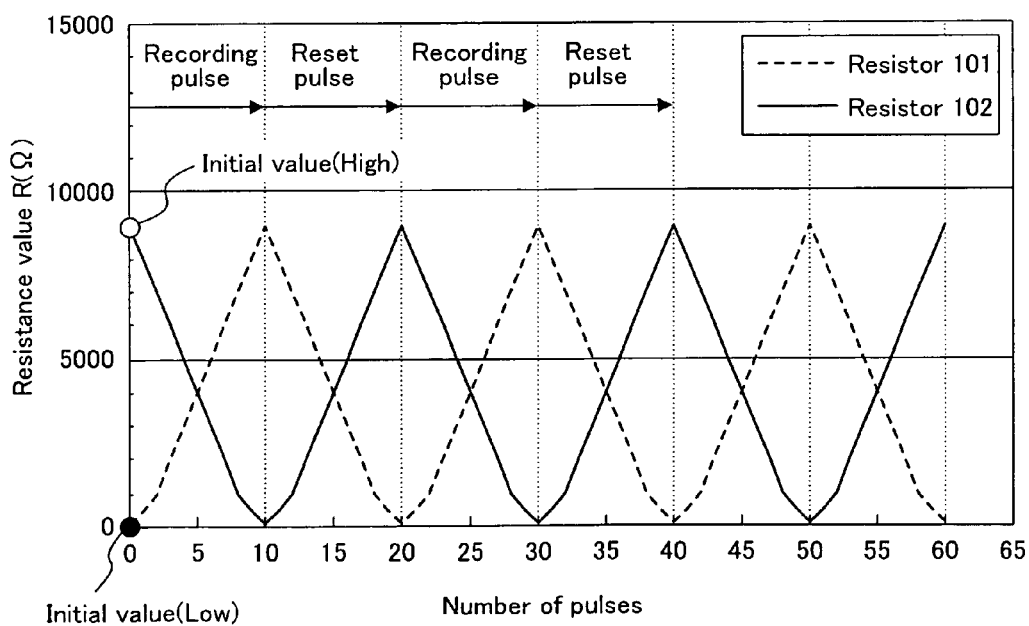

FIG. 33
(a) Resistance variation over number of pulses
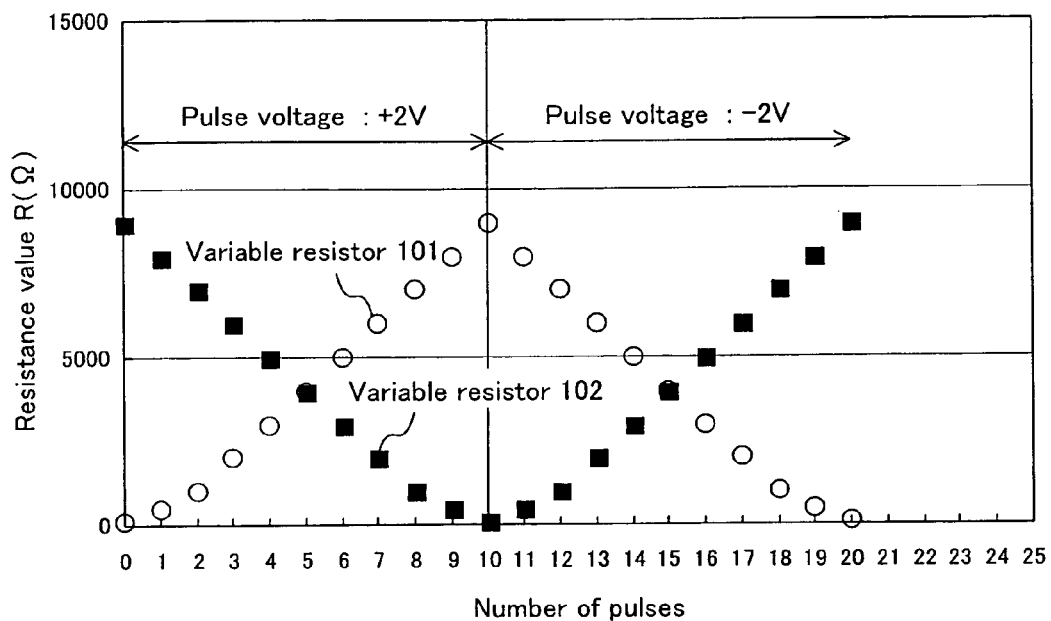
(b) Output voltage when reading recorded state
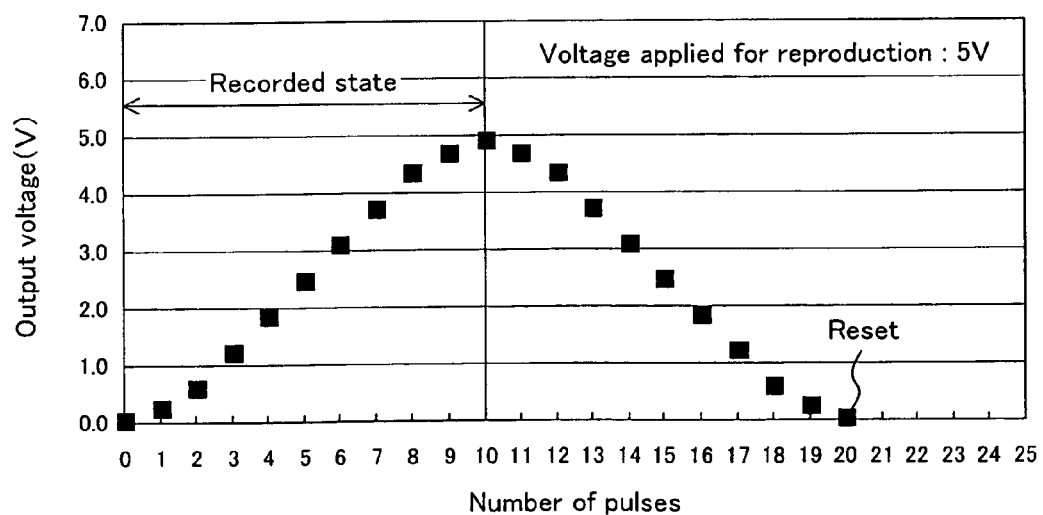

FIG. 34
(a) Resistance variation over number of pulses
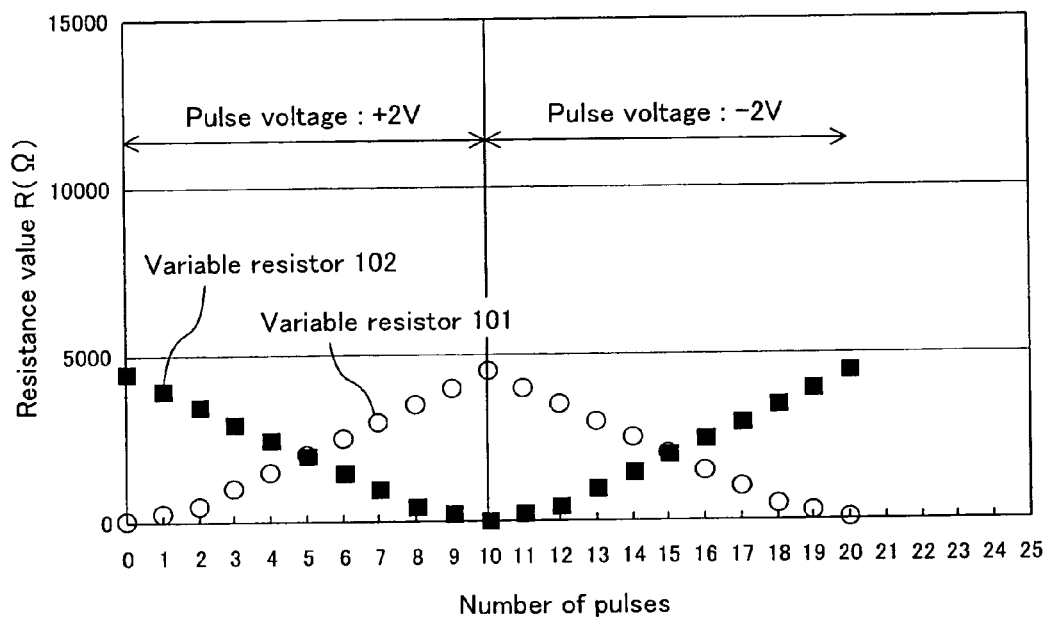
(b) Output voltage when reading recorded state
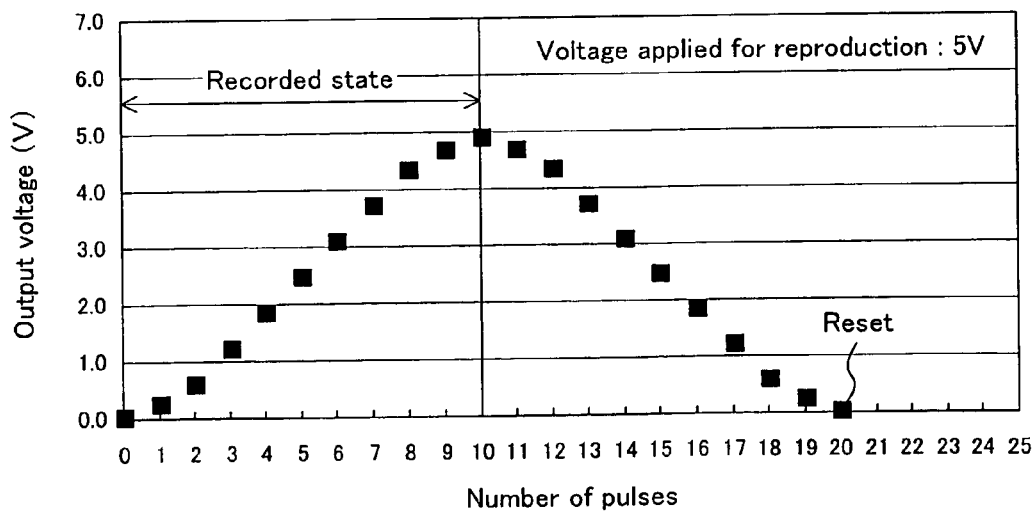

FIG. 35
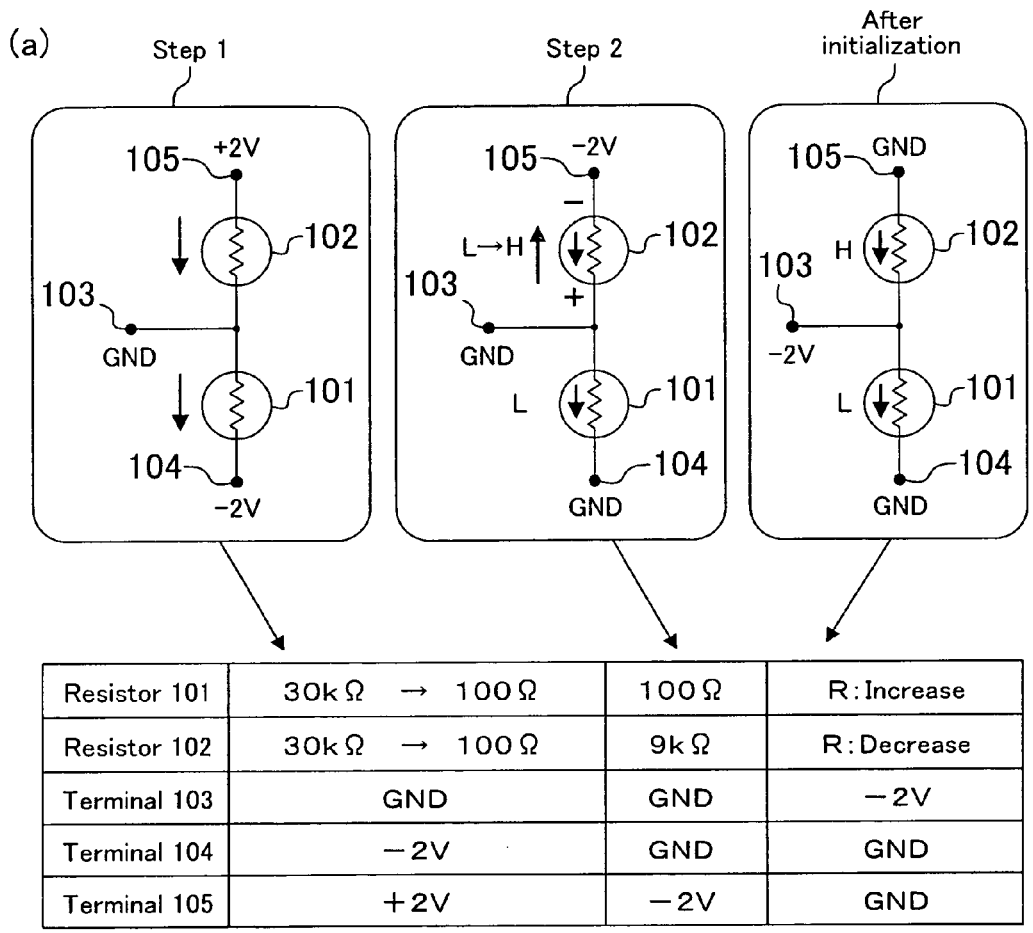
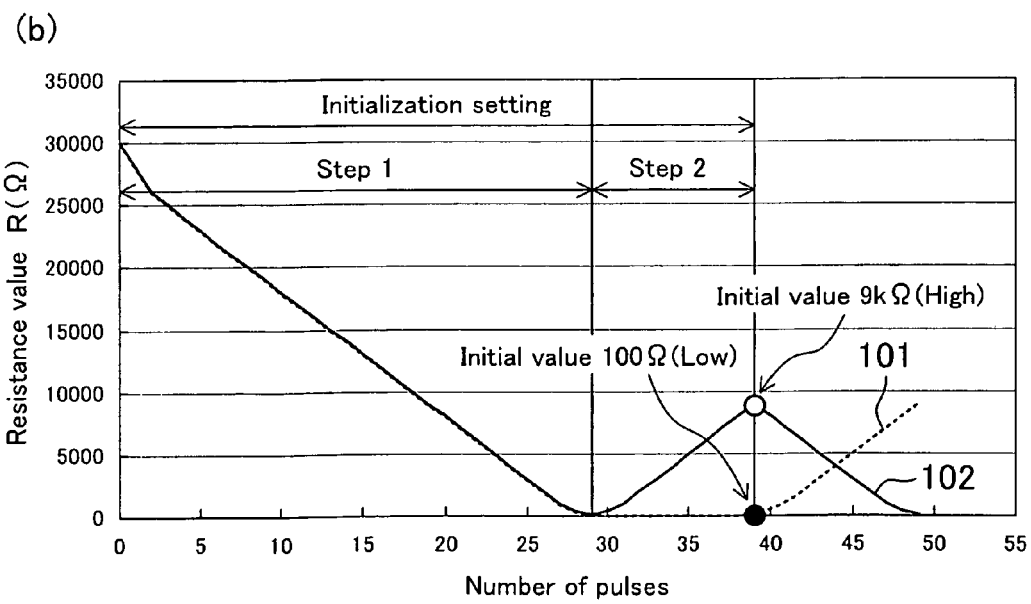

FIG. 36
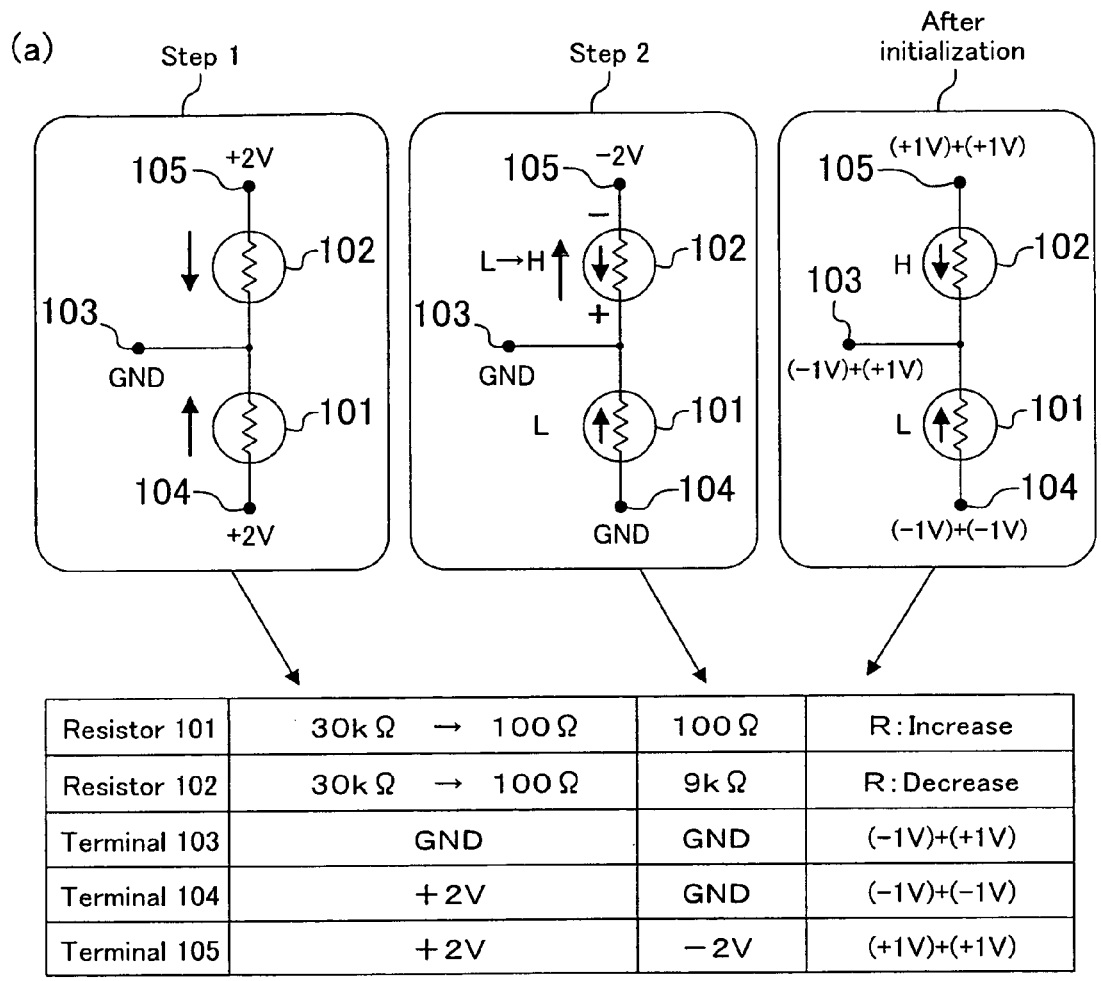
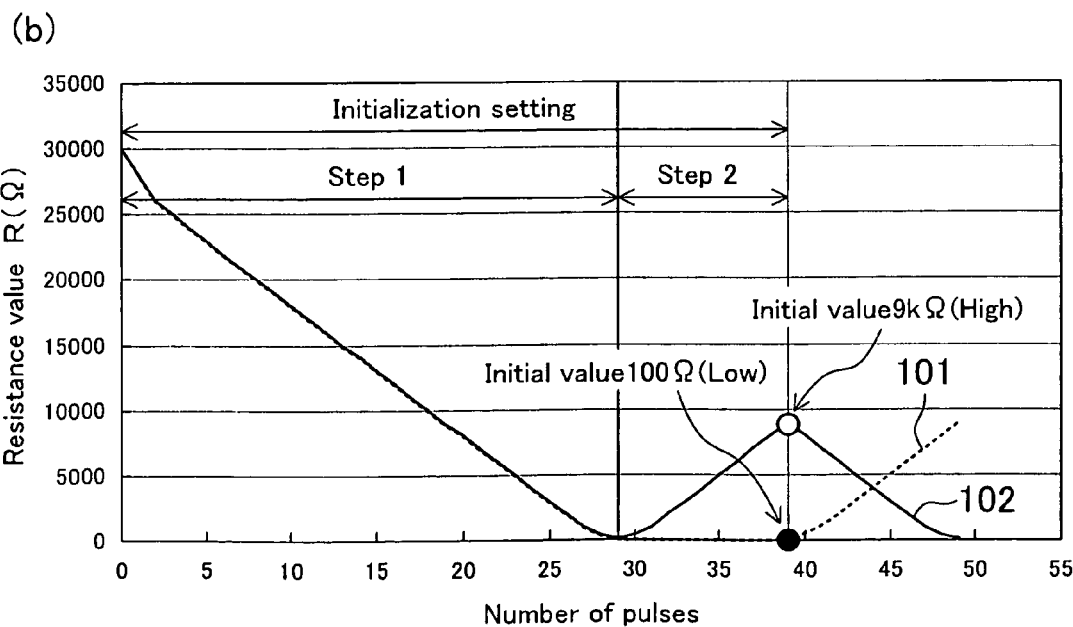

FIG. 37
(a)
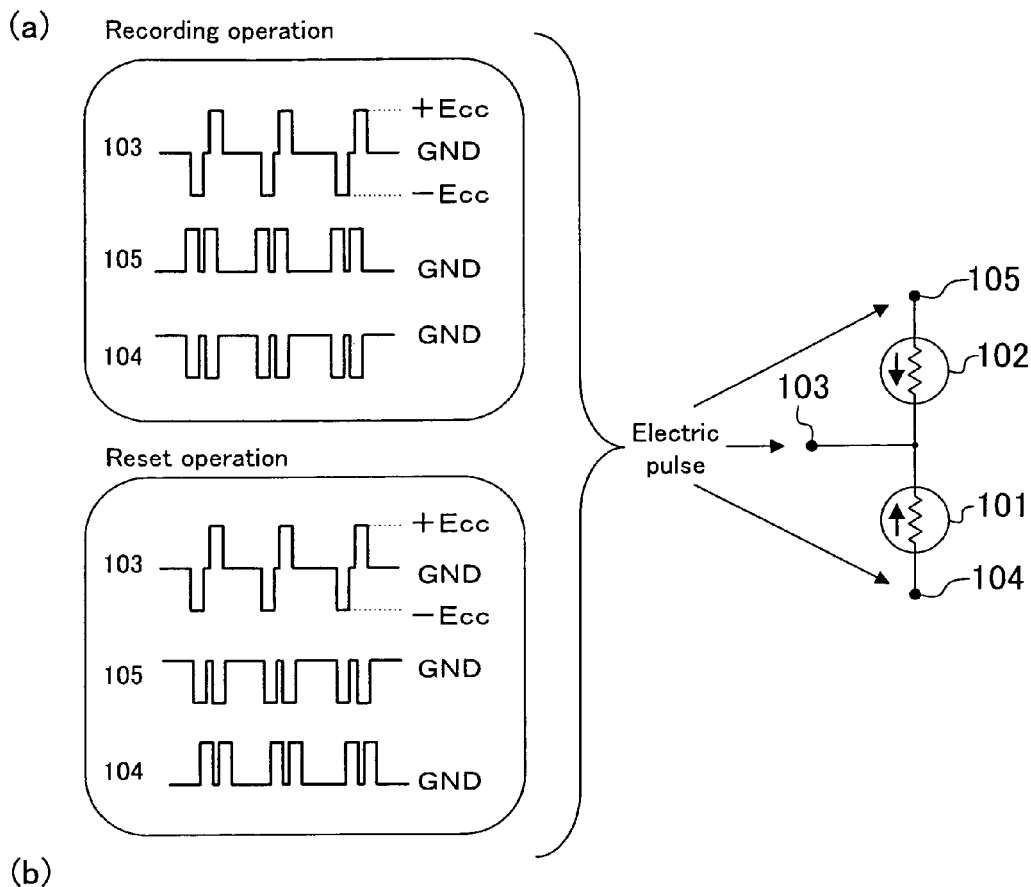
(b)
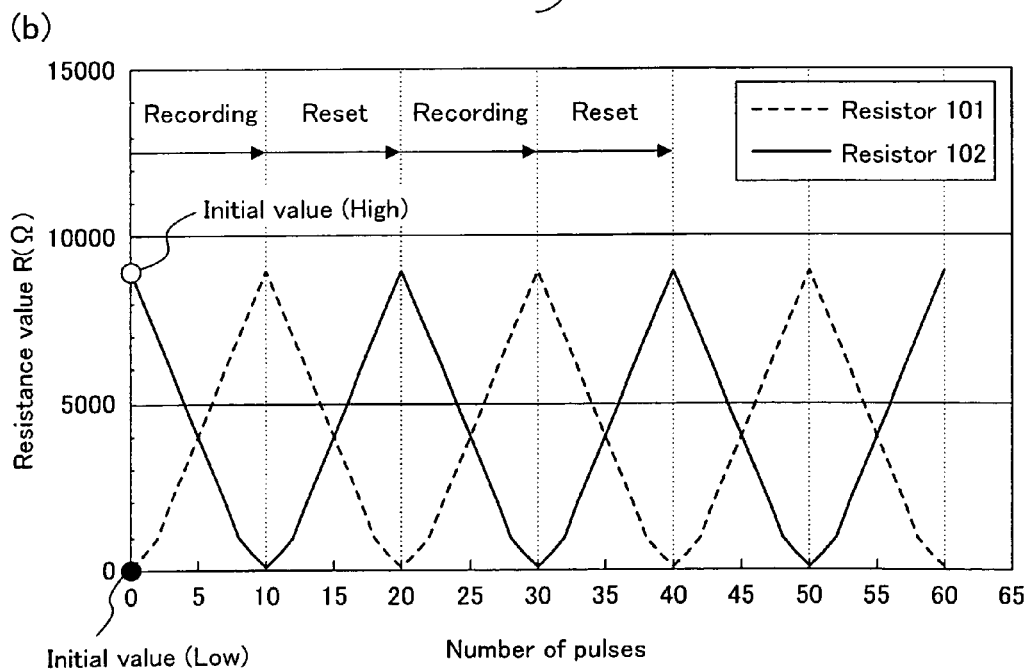

FIG. 38
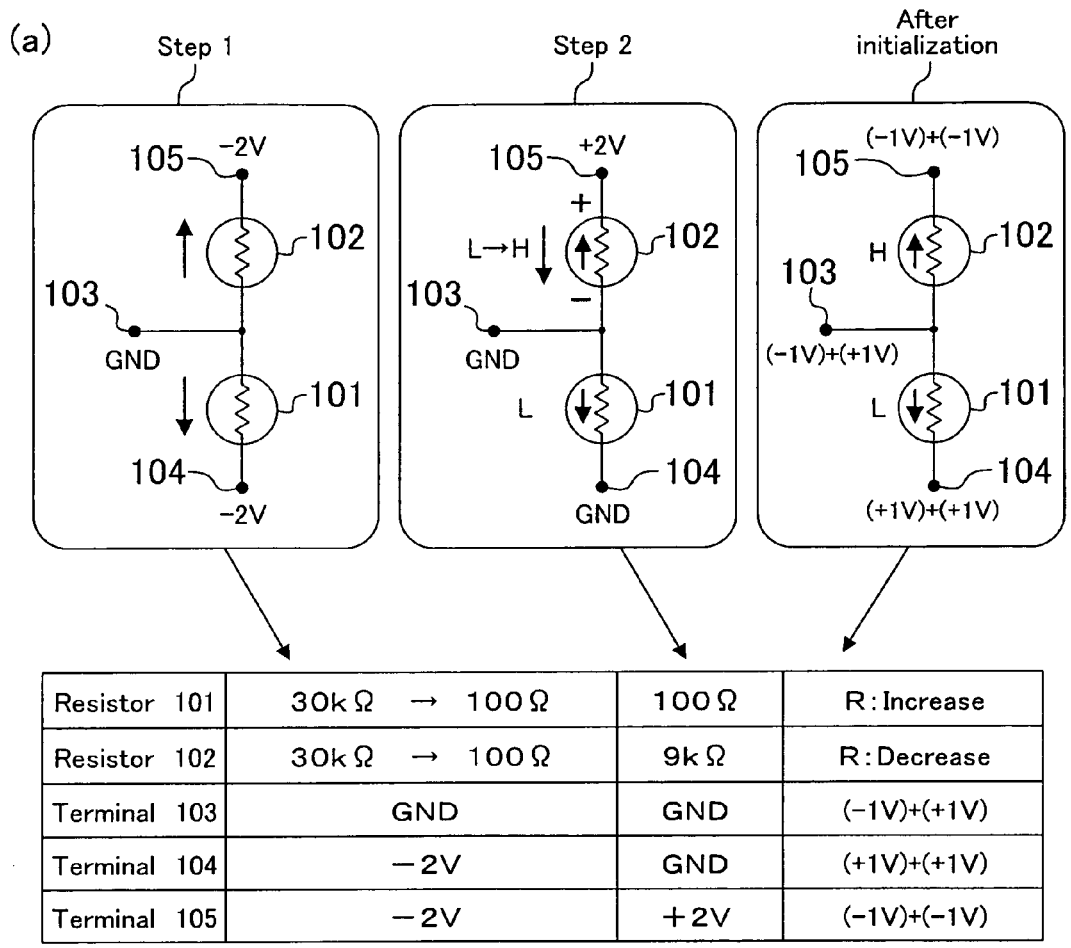
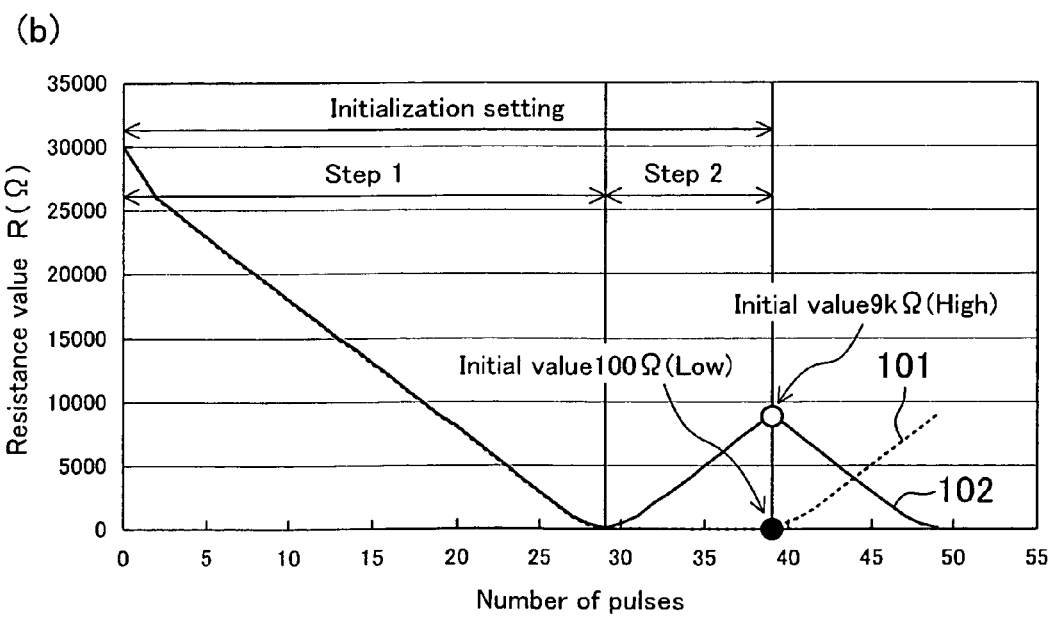

METHOD FOR INITIALIZING RESISTANCE-VARIABLE MATERIAL, MEMORY DEVICE CONTAINING A RESISTANCE-VARIABLE MATERIAL, AND METHOD FOR INITIALIZING NONVOLATILE MEMORY CIRCUIT INCLUDING VARIABLE RESISTOR

RELATED APPLICATIONS

This application is a Divisional of U.S. application Ser. No. 10/583,518, filed Jun. 16, 2006, now U.S. Pat. No. 7,369,431 claiming priority of U.S. National Phase under 35 U.S.C. §371 of International Application No. PCT/JP2004/019291, filed on Dec. 16, 2004, claiming priority of Japanese Application Nos. 2003-421374, filed on Dec. 18, 2003, and Japanese Application No. 2003-435501, filed on Dec. 26, 2003, the entire contents of each of which are hereby incorporated by reference.

TECHNICAL FIELD

The present invention relates to a method for initializing a material whose resistance value varies according to the polarity of an applied electric pulse (resistance-variable material), a memory device formed using the resistance-variable material, and a method for initializing a nonvolatile memory circuit formed using a variable resistor whose resistance value varies according to the polarity of an applied pulse voltage.

BACKGROUND ART

In recent years, along with the advancement of the digital techniques in electronic devices, demands for increasing the capacity of a solid state memory device and the data transfer speed have been growing for storing data, such as images, and the like. In order to meet such demands, for example, a solid state memory device is formed by using a material whose resistance value varies according to an applied electric pulse (e.g., $Pr_{1-x}Ca_xMnO_3$ (PCMO), $LaSrMnO_3$ (LSMO), $GdBa-Co_xO_y$ (GBCO), etc.) as disclosed in U.S. Pat. No. 6,473,332. These materials (hereinafter, referred to as "variable-resistance material(s)") have resistance values which increase or decrease according to the polarity of an electric pulse. In a nonvolatile memory device formed using such a material, the resistance value that changes according to the polarity of the electric pulse is used for memorization of different values.

As described above, the variable-resistance material has a characteristic such that the resistance value increases or decreases according to the polarity of an applied electric pulse. However, it is indefinite at the time of formation of a film of the variable-resistance material whether or not the resistance value of the film increases or decreases by a specific amount with high reproducibility when an electric pulse of a specific polarity is applied to the variable-resistance material film. Thus, a desired resistive state cannot be achieved even when an electric pulse is applied, and therefore, it is difficult to use the material for a memory device. Further, it is necessary to provide a specific structure of a memory device which uses a variable-resistance material.

In recent years, along with the advancement of the digital techniques in electronic devices, demands for nonvolatile memory devices have been increasing for storing data, such as images, and the like. Further, demands for an increase in the capacity of a memory device, a reduction in the writing power, a reduction in the write/read time, and longer life have been growing. There has been a flash memory which is presently in practical use, wherein nonvolatility is achieved using a mechanism such that a floating gate is provided at the gate part of a semiconductor transistor and electrons are injected in the floating gate. This flash memory has been used as an external memory device in a variety of digital cameras and personal computers.

However, the flash memory has numerous disadvantages, such as a high write voltage, a long write/erase time, short rewritable life, difficulty in increasing capacity (miniaturization of devices), etc. Thus, in order to overcome such disadvantages of the flash memory, development of novel nonvolatile memory devices, such as a semiconductor memory formed using ferroelectric (FeRAM), a semiconductor memory formed using a TMR (Tunnel MR) material (MRAM), a semiconductor memory formed using a phase-change material (OUM), etc., has been actively conducted. However, these memory devices also have disadvantages, such as difficulty in miniaturization of FeRAM device, a high write voltage in MRAM, short rewritable life of OUM, etc. Presently, there is no memory device which meets all the demands placed on the nonvolatile memory devices. Further, there has been developed by the researchers of the University of Houston a new recording method which overcomes the above disadvantages wherein the resistance value of a perovskite structure oxide is changed according to a pulse voltage (U.S. Pat. No. 6,204,139). However, as of now, this method causes significant problems in the stability of operation and production yield of a memory device.

DISCLOSURE OF INVENTION

According to the present invention, there is provided a method for initializing a material (variable-resistance material) whose resistance value increases/decreases according to the polarity of an applied electric pulse, wherein an electric pulse having a first polarity is applied at least once between first and second electrodes connected to the variable-resistance material such that the potential of the first electrode is higher than that of the second electrode.

In the above initialization method, preferably, the first electric pulse is repeatedly applied between the first and second electrodes till the variation rate of the resistance value of the variable-resistance material becomes smaller than a predetermined value.

Preferably, after the first electric pulse is repeatedly applied between the first and second electrodes till the variation rate of the resistance value of the variable-resistance material becomes smaller than a predetermined value, an electric pulse having a second polarity is applied at least once between first and second electrodes connected to the variable-resistance material such that the potential of the first electrode is lower than that of the second electrode.

Preferably, the second electric pulse is repeatedly applied between the first and second electrodes till the variation rate of the resistance value of the variable-resistance material becomes smaller than a predetermined value.

According to the present invention, there is provided a memory device formed using a material (variable-resistance material) whose resistance value increases/decreases according to the polarity of an applied electric pulse, comprising: a variable-resistance material to which first and second electrodes are connected; and a fixed resistor, one end of which is connected to the first or second electrode, wherein an electric pulse is applied for recording between the first and second electrodes.

In the above memory device, preferably, memory information is read based on a voltage between the first and second electrodes which is obtained when a predetermined voltage is applied between one of the first and second electrodes which is not connected to the one end of the fixed resistor and the other end of the fixed resistor.

In the above memory device, preferably, memory information is read based on a voltage between the ends of the fixed resistor which is obtained when a predetermined voltage is applied between one of the first and second electrodes which is not connected to the one end of the fixed resistor and the other end of the fixed resistor.

In the above memory device, preferably, the variable-resistance material is initialized in advance by the aforementioned initialization method.

An electric pulse for initialization, which has a predetermined polarity, is applied at least once to a material whose resistance value is changed by an electric pulse. As a result, the resistance of the material can be decreased by applying to the initialized variable-resistance material an electric pulse which has the same polarity as that of the initialization electric pulse, and the resistance of the material can be increased by applying to the initialized variable-resistance material an electric pulse which has a polarity opposite to that of the initialization electric pulse. After performing this initialization, the resistance value of the variable-resistance material can be changed to a desired value by selecting a polarity same as or opposite to that of the initialization electric pulse and applying an electric pulse having the selected polarity for recording.

In the case where a device is formed using a variable-resistance material, the device includes a resistive portion made of the variable-resistance material and a fixed resistance portion whose resistance value does not change such that the fixed resistance portion is connected in series to the resistive portion, wherein an electric pulse for recording is applied between the ends of the variable-resistance material, and electrodes for reading the recorded state are provided at the ends of the variable resistor. With this structure, the device can function as a memory device.

Alternatively, the device includes a resistive portion made of the variable-resistance material and a fixed resistance portion whose resistance value does not change such that the fixed resistance portion is connected in series to the resistive portion, wherein an electric pulse for recording is applied between the ends of the variable-resistance material, and electrodes for reading the recorded state are provided at the ends of the fixed resistor. With this structure, the device can function as a memory device.

According to the present invention, there is provided a method for initializing a memory circuit, the memory circuit including first and second variable resistors connected in series between a first terminal and a second terminal, the first variable resistor being connected between the first terminal and a third terminal and having a resistance value which increases/decreases according to the polarity of a pulse voltage applied between the first terminal and the third terminal, and the second variable resistor being connected between the third terminal and the second terminal and having a resistance value which increases/decreases according to the polarity of a pulse voltage applied between the third terminal and the second terminal, the initialization method comprising the steps of: (a) in an initial state where the first and second variable resistors have not yet been subjected to application of a pulse voltage, applying a first pulse voltage having a first polarity between the first terminal and the third terminal at least once and applying a second pulse voltage having a second polarity between the third terminal and the second terminal at least once; and (b) after the application of the pulse voltages at step (a), applying a third pulse voltage having a polarity opposite to that of the pulse voltage applied at step (a) at least once to any one of a portion between the first terminal and the third terminal and a portion between the third terminal and the second terminal.

In the above initialization method, two variable resistors whose resistance values change according to an electric pulse (s) are connected in series, and pulse voltages which have the same or opposite polarities are applied to these two variable resistors, whereby the resistance values of the variable resistors are decreased. Thereafter, a pulse voltage having a polarity opposite to that of the previous one is applied to any one of the two variable resistors, whereby the resistance value of this variable resistor is increased. In this way, the resistance values of the two variable resistors are initialized to two states, a low value (Low) and a high value (High).

By using a nonvolatile memory initialized according to the initialization method of the present invention, various disadvantages of the conventional nonvolatile memory devices, e.g., a high write voltage, a long write time, short rewritable life, difficulty in increasing capacity (miniaturization of devices), etc., are all overcome.

BRIEF DESCRIPTION OF DRAWINGS

FIG. 18 shows examples of the shape of an electric pulse.

FIG. 29A shows a structure of a variable-resistor in the memory circuit shown in FIG. 27.

FIG. 29B shows a variation in the resistance value in the process of initialization with positive pulse voltages applied onto a surface of the variable-resistor shown in FIG. 29A together with the symbols of the variable-resistor after initialization.

FIG. 30 illustrates a method for initializing a memory circuit according to embodiment 3.

FIG. 31 shows a resistance variation at the time of recording and the reproduction output voltage corresponding to the recorded states, and a resistance variation at the time of a reset and a variation in the output voltage according to embodiment 3.

FIG. 33 shows resistance variations and output variations of a variable-resistor included in a memory cell at the time of recording/reset according to embodiment 3.

FIG. 34 shows resistance variations and output variations of a variable-resistor included in another memory cell (with a small resistance variation) at the time of recording/reset according to embodiment 3.

FIG. 35 illustrates a method for initializing a memory circuit according to embodiment 4.

FIG. 36 illustrates a method for initializing a memory circuit according to embodiment 5.

FIG. 37 shows a resistance variation at the time of recording and the reproduction output voltage corresponding to the recorded states, and a resistance variation at the time of a reset and a variation in the output voltage according to embodiment 5.

FIG. 38 illustrates a method for initializing a memory circuit according to embodiment 6.

BEST MODE FOR CARRYING OUT THE INVENTION

Figure 1:
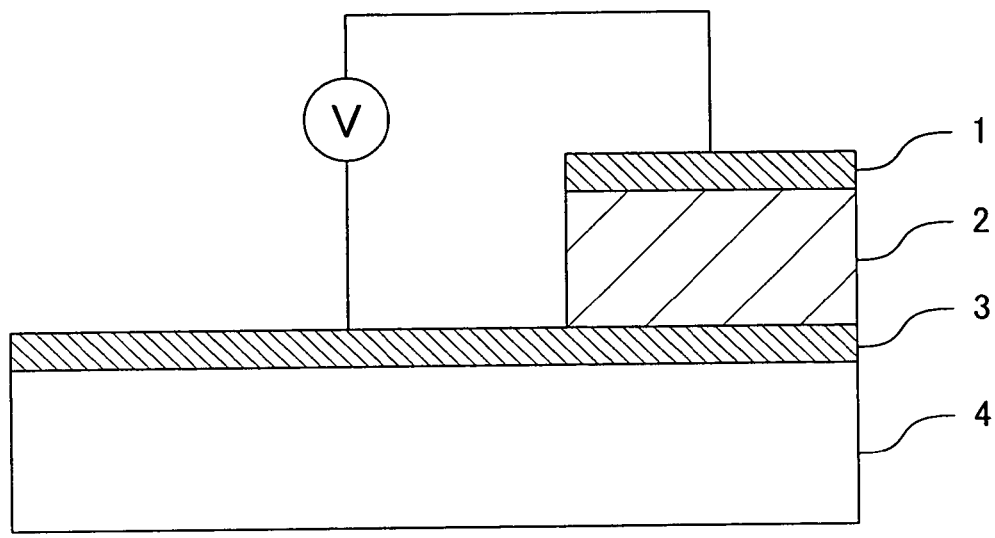
FIG. 1 shows a structure of a variable-resistance material and electrodes.

Hereinafter, embodiments of the present invention will be described with reference to the drawings. It should be noted that like elements are denoted by like reference numerals throughout the drawings, and the descriptions thereof are not repeated.

Embodiment 1

Composition of Variable-Resistance Material

A variable-resistance material used in the present invention is an oxide CMR material having a perovskite structure or a high-temperature superconductor material having a perovskite structure, and specifically, $Pr_{1-x}Ca_xMnO_3$ (PCMO), $LaSrMnO_3$, $GdBaCo_xO_y$, or the like. FIG. 1 shows a variable-resistance material and electrodes. A film of a variable-resistance material 2 (herein, $Pr_{0.7}Ca_{0.3}MnO_3$) is formed on a substrate 4 by sputtering so as to have a thickness of about 0.8 µm. Pt films each having a thickness of 0.4 µm are formed as an upper electrode 1 and a lower electrode 3 for the variable-resistance material film 2.

<First Method for Initializing Variable-Resistance Material>

Figure 2:
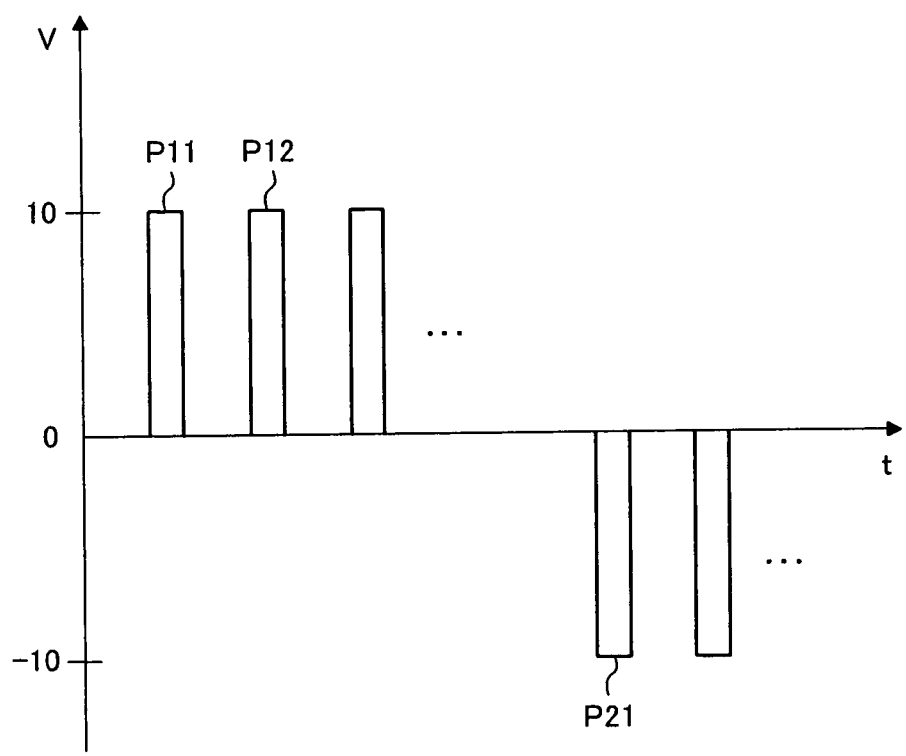
FIG. 2 shows an example of electric pulses for initialization.
Figure 3:
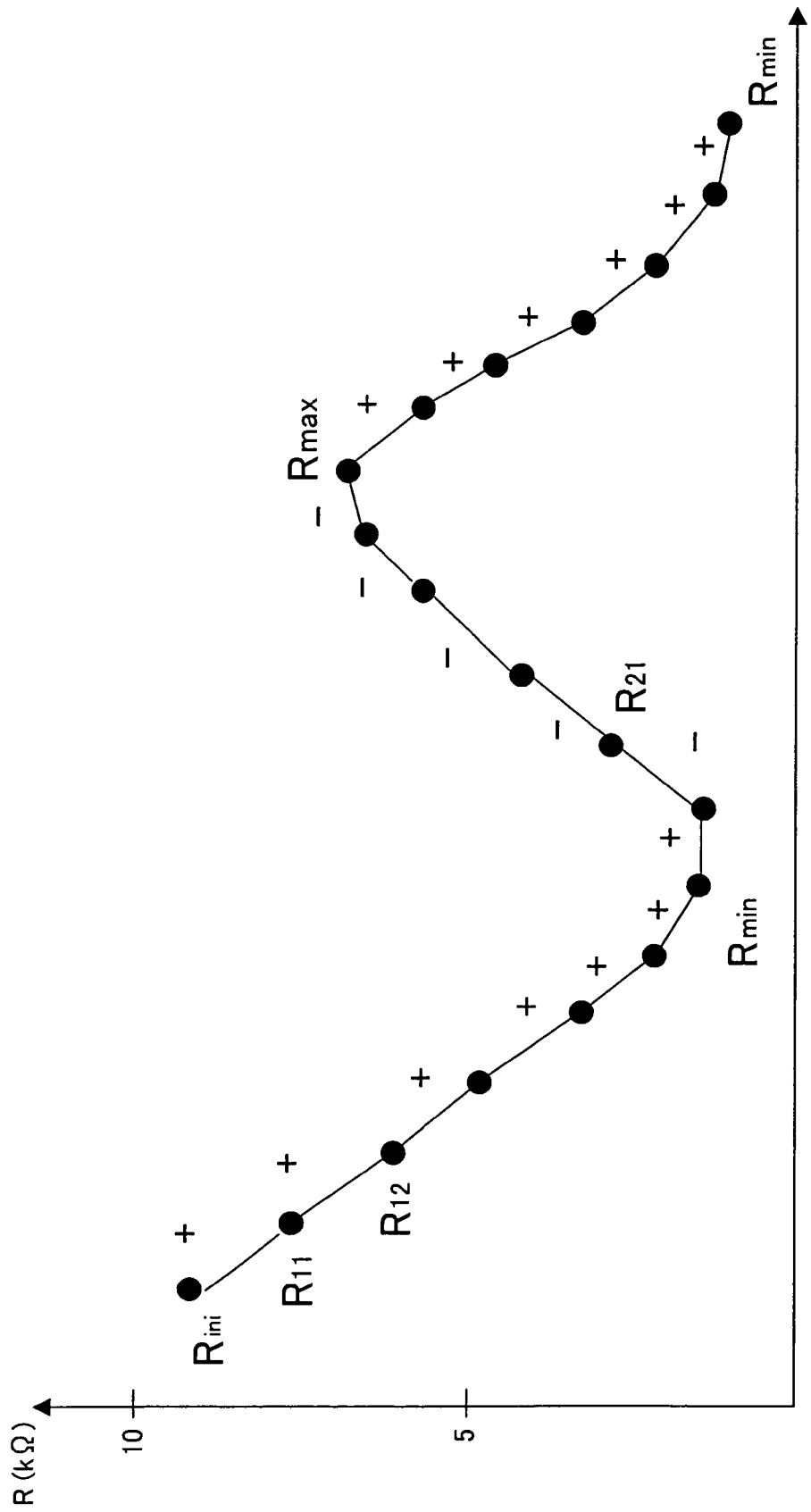
FIG. 3 shows an example of resistance variation which occurs according to electric pulses.

In the first place, an electric pulse P11 shown in FIG. 2 is applied between the electrodes 1 and 3 shown in FIG. 1 such that the upper electrode 1 becomes positive (the potential of the electrode 1 is higher than that of the electrode 3). The voltage of the pulse P11 is 10 V. The pulse width of the pulse P11 is 1 µs. As shown in FIG. 3, after the application of the electric pulse P11, the resistance value of the variable-resistance material film 2 decreases from initial value $R_{ini}$ to $R_{11}$. It should be noted that in FIG. 3 the symbol "+" means that an electric pulse is applied such that the electrode 1 becomes positive (the potential of the electrode 1 is higher than that of the electrode 3), and the symbol "−" means that an electric pulse is applied such that the electrode 1 becomes negative (the potential of the electrode 1 is lower than that of the electrode 3).

Then, an electric pulse P12 of the same polarity (see FIG. 2) is applied between the electrodes 1 and 3, so that the resistance value of the variable-resistance material film 2 further decreases from $R_{11}$ to $R_{12}$ (see FIG. 3).

An electric pulse having the same polarity as those of the pulses P11 and P12 is applied a plurality of times, the resistance value of the variable-resistance material film 2 further decreases. However, after the number of times of application exceeds a certain number, the decrease of the resistance value becomes saturated (the variation rate of the resistance value becomes smaller than a predetermined value), and the resistance value does not become substantially smaller than minimum value $R_{min}$ (see FIG. 3).

Then, an electric pulse P21 shown in FIG. 2 is applied between the electrodes 1 and 3 shown in FIG. 1 such that the upper electrode 1 becomes negative (the potential of the electrode 1 is lower than that of the electrode 3). As a result, the resistance value of the variable-resistance material film 2 increases from $R_{min}$ to $R_{21}$.

By further applying electric pulses such that the upper electrode 1 becomes negative, the resistance value of the variable-resistance material film 2 continues to increase. However, after the number of times of application exceeds a certain number, the increase of the resistance value becomes saturated (the variation rate of the resistance value becomes smaller than a predetermined value), and the resistance value does not become substantially larger than maximum value $R_{max}$.

Thereafter, the resistance value of the variable-resistance material film 2 can be decreased within the range between $R_{max}$ and $R_{min}$ by applying a pulse such that the upper electrode 1 becomes positive ("+") and can be increased within the range between $R_{max}$ and $R_{min}$ by applying a pulse such that the upper electrode 1 becomes negative ("−").

<Second Method for Initializing Variable-Resistance Material>

Figure 4:
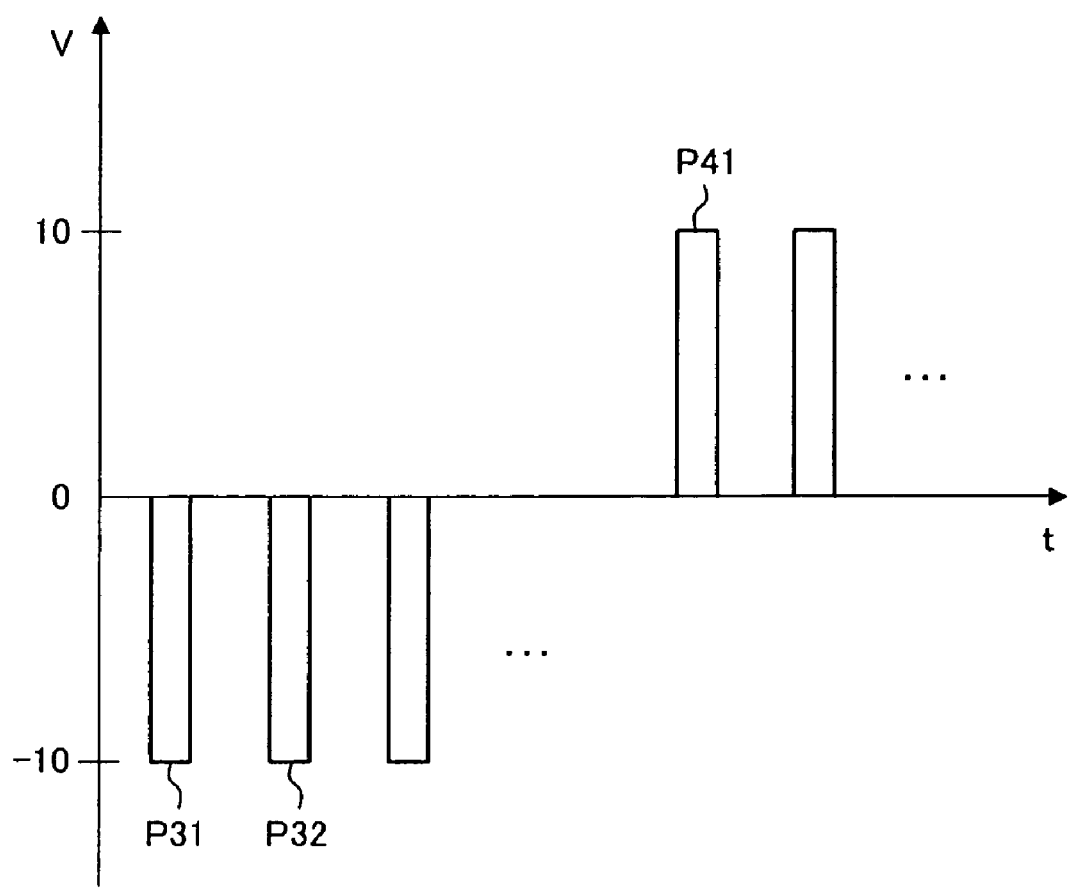
FIG. 4 shows an example of electric pulses for initialization.
Figure 5:
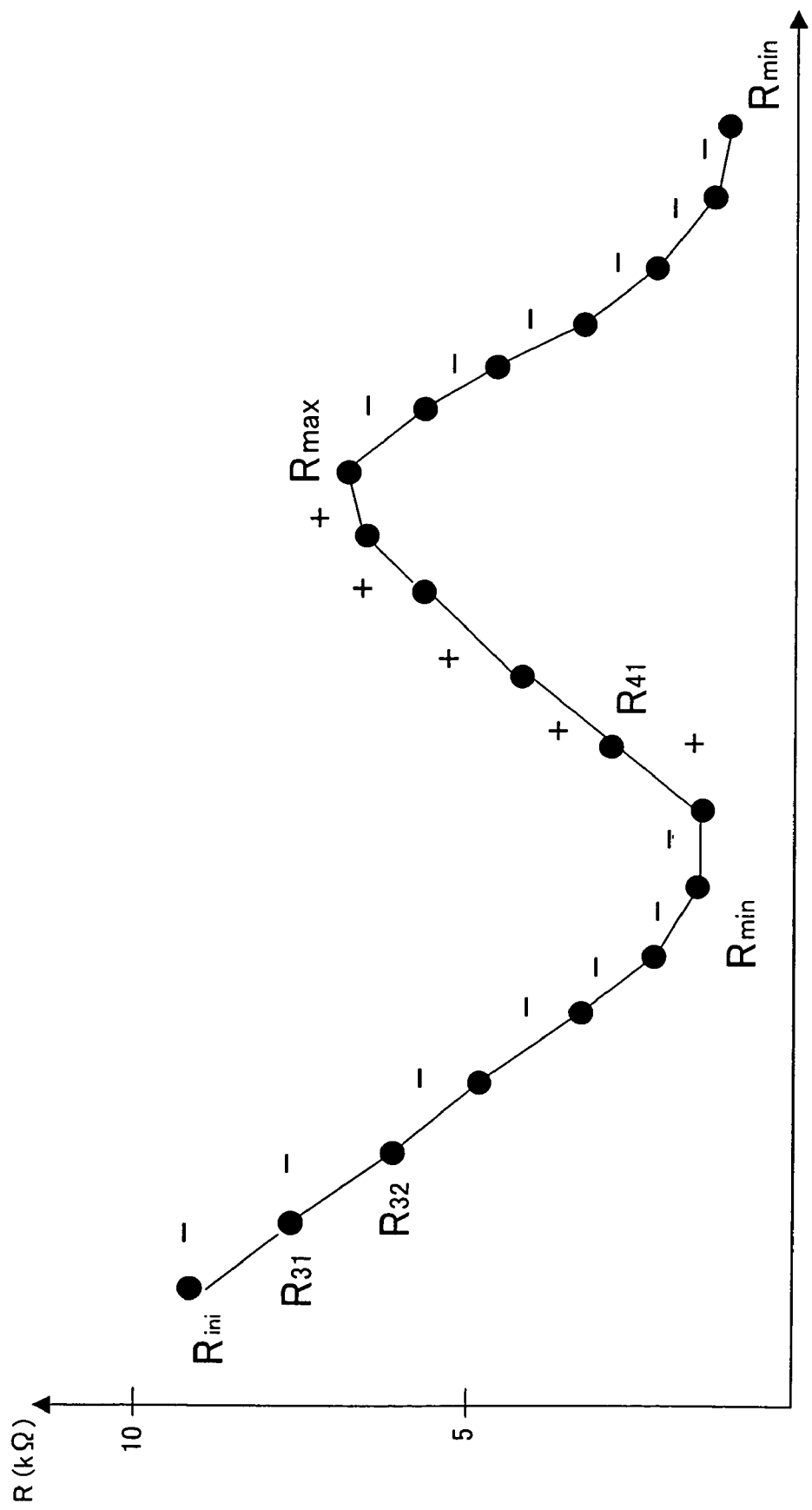
FIG. 5 shows an example of resistance variation which occurs according to electric pulses.

In the first place, an electric pulse P31 shown in FIG. 4 is applied to another sample prepared in the same way as described with FIG. 1 such that the upper electrode 1 becomes positive. The voltage of the pulse P31 is −10 V. The pulse width of the pulse P31 is 1 µs. As shown in FIG. 5, after the application of the electric pulse P31, the resistance value of the variable-resistance material film 2 decreases from initial value Rim to $R_{31}$.

Then, an electric pulse P32 of the same polarity (see FIG. 4) is applied to the sample, so that the resistance value of the variable-resistance material film 2 further decreases from $R_{31}$ to $R_{32}$ (see FIG. 5).

An electric pulse having the same polarity as those of the pulses P31 and P32 is applied a plurality of times, so that the resistance value of the variable-resistance material film 2 further decreases. However, after the number of times of application exceeds a certain number, the decrease of the resistance value becomes saturated, and the resistance value does not become substantially smaller than minimum value $R_{min}$ (see FIG. 5).

Then, an electric pulse P41 shown in FIG. 4 is applied between the electrodes 1 and 3 such that the upper electrode 1 becomes positive. As a result, the resistance value of the variable-resistance material film 2 increases from $R_{min}$ to $R_{41}$.

By further applying electric pulses such that the upper electrode 1 becomes positive, the resistance value of the variable-resistance material film 2 continues to increase. However, after the number of times of application exceeds a certain number, the increase of the resistance value becomes saturated, and the resistance value does not become substantially larger than maximum value $R_{max}$.

Thereafter, the resistance value of the variable-resistance material film 2 can be decreased within the range between $R_{max}$ and $R_{min}$ by applying a pulse such that the upper electrode 1 becomes negative ("−") and can be increased within the range between $R_{max}$ and $R_{min}$ by applying a pulse such that the upper electrode 1 becomes positive ("+").

<Third Method for Initializing Variable-Resistance Material>

Figure 6:
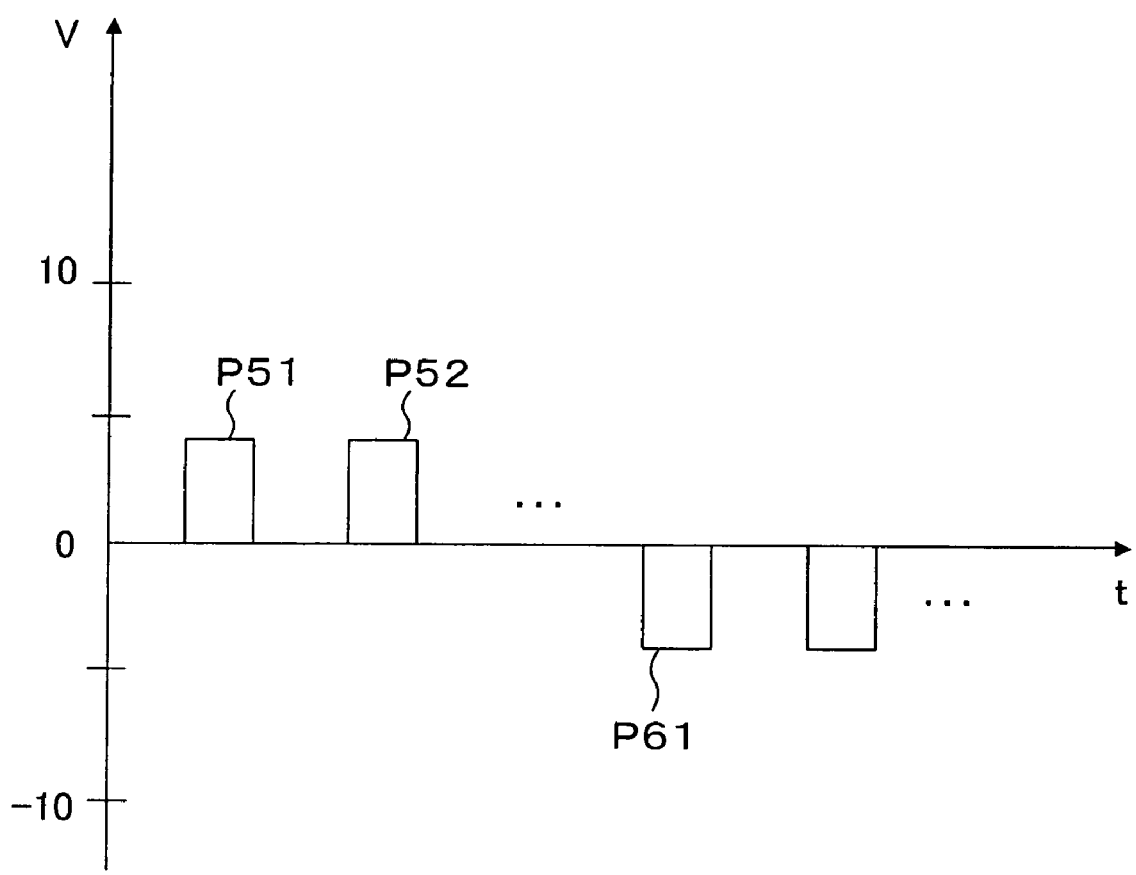
FIG. 6 shows an example of electric pulses for initialization.
Figure 7:
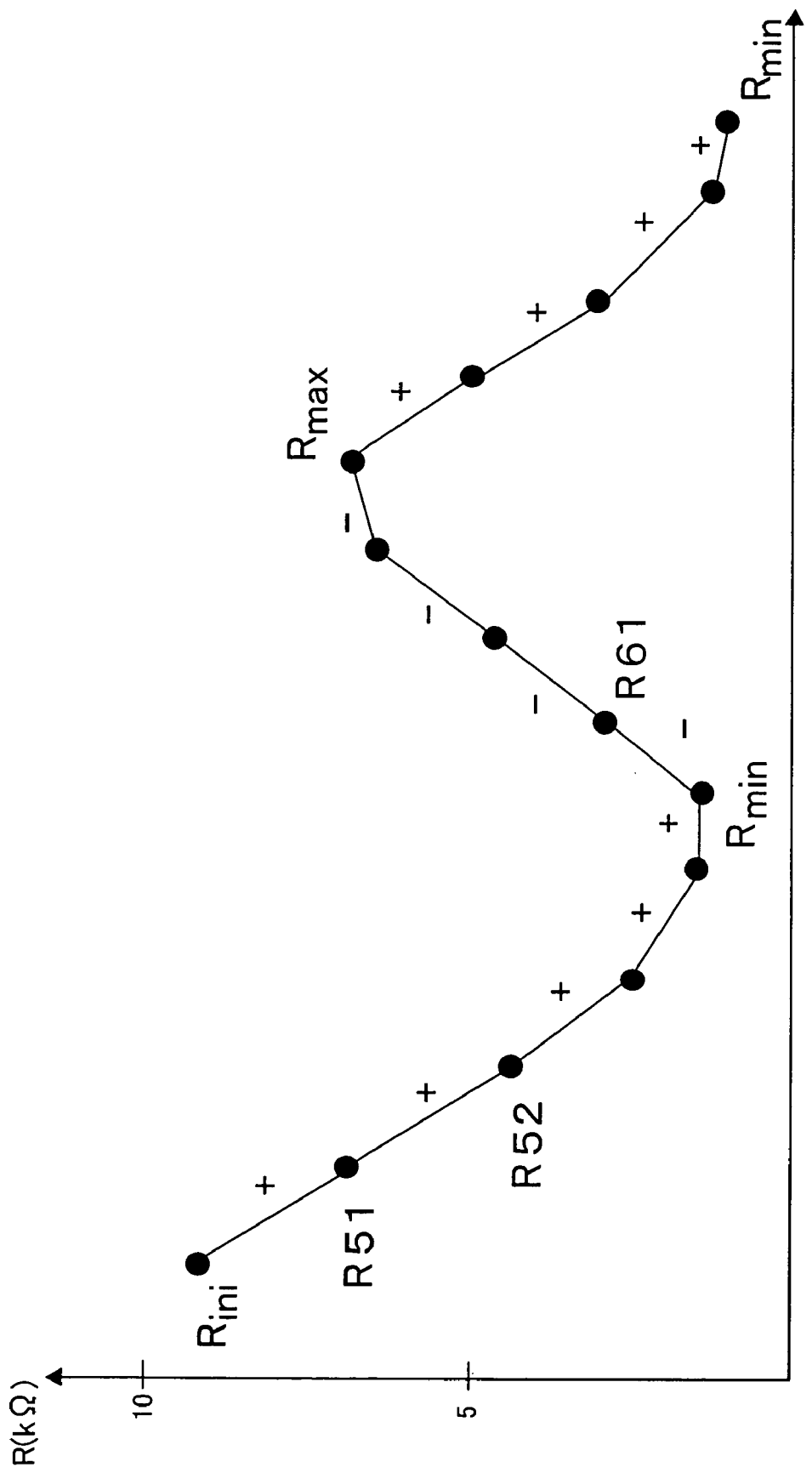
FIG. 7 shows an example of resistance variation which occurs according to electric pulses.

In the first place, an electric pulse P51 shown in FIG. 6 is applied between the electrodes 1 and 3 shown in FIG. 1 such that the upper electrode 1 becomes positive (the potential of the electrode 1 is higher than that of the electrode 3). The voltage of the pulse P51 is 4 V. The pulse width of the pulse P51 is 100 ms. As shown in FIG. 7, after the application of the electric pulse P51, the resistance value of the variable-resistance material film 2 decreases from initial value $R_{ini}$ to $R_{51}$. It should be noted that in FIG. 7 the symbol "+" means that an electric pulse is applied such that the electrode 1 becomes positive (the potential of the electrode 1 is higher than that of the electrode 3), and the symbol "−" means that an electric pulse is applied such that the electrode 1 becomes negative (the potential of the electrode 1 is lower than that of the electrode 3).

Then, an electric pulse P52 of the same polarity (see FIG. 6) is applied between the electrodes 1 and 3, so that the resistance value of the variable-resistance material film 2 further decreases from $R_{51}$ to $R_{52}$ (see FIG. 7).

An electric pulse having the same polarity as those of the pulses P51 and P52 is applied a plurality of times, so that the resistance value of the variable-resistance material film 2 further decreases. However, after the number of times of application exceeds a certain number, the decrease of the resistance value becomes saturated (the variation rate of the resistance value becomes smaller than a predetermined value), and the resistance value does not become substantially smaller than minimum value $R_{min}$ (see FIG. 7).

Then, an electric pulse P61 shown in FIG. 6 is applied between the electrodes 1 and 3 shown in FIG. 1 such that the upper electrode 1 becomes negative (the potential of the electrode 1 is lower than that of the electrode 3). As a result, the resistance value of the variable-resistance material film 2 increases from $R_{min}$ to $R_{61}$.

By further applying electric pulses such that the upper electrode 1 becomes negative, the resistance value of the variable-resistance material film 2 continues to increase. However, after the number of times of application exceeds a certain number, the increase of the resistance value becomes saturated (the variation rate of the resistance value becomes smaller than a predetermined value), and the resistance value does not become substantially larger than maximum value $R_{max}$.

Thereafter, the resistance value of the variable-resistance material film 2 can be decreased within the range between $R_{max}$ and $R_{min}$ by applying a pulse such that the upper electrode 1 becomes positive ("+") and can be increased within the range between $R_{max}$ and $R_{min}$ by applying a pulse such that the upper electrode 1 becomes negative ("−").

<Fourth Method for Initializing Variable-Resistance Material>

Figure 8:
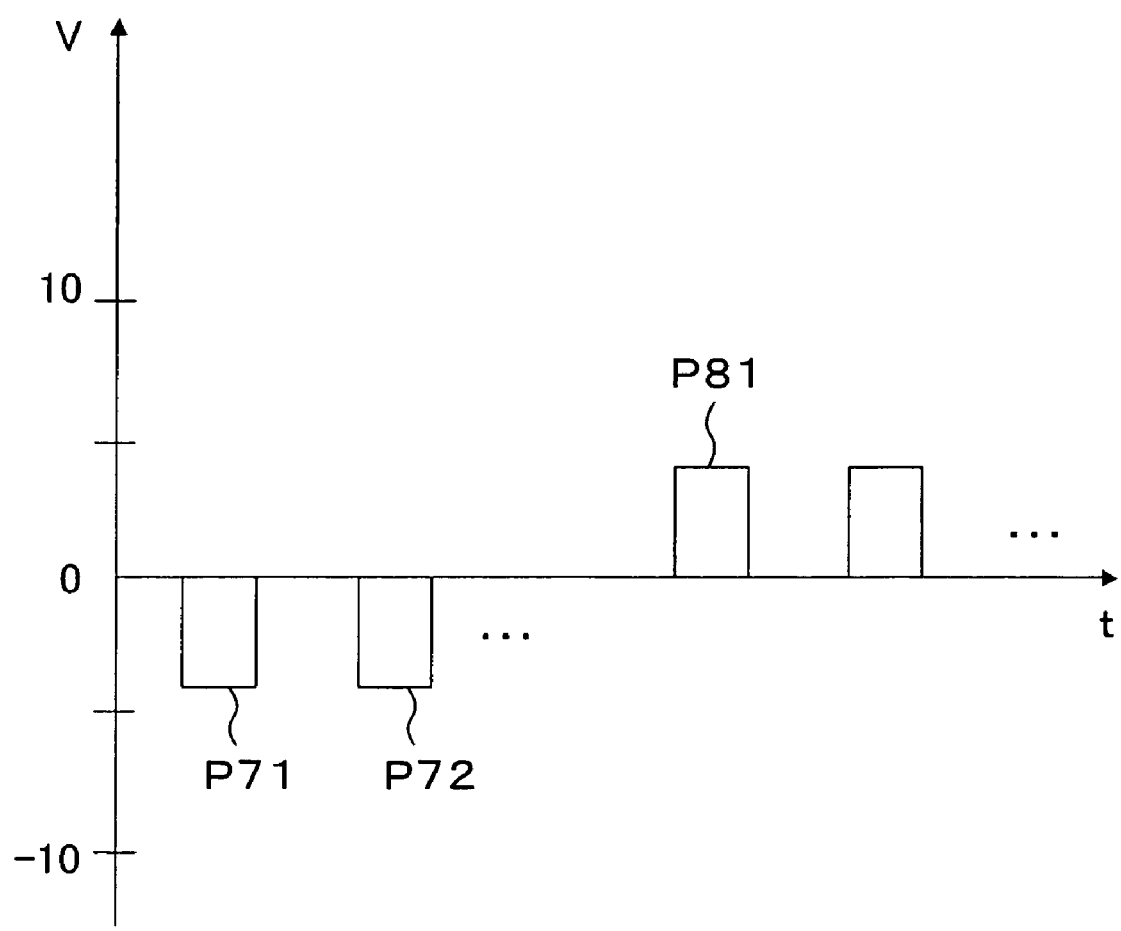
FIG. 8 shows an example of electric pulses for initialization.
Figure 9:
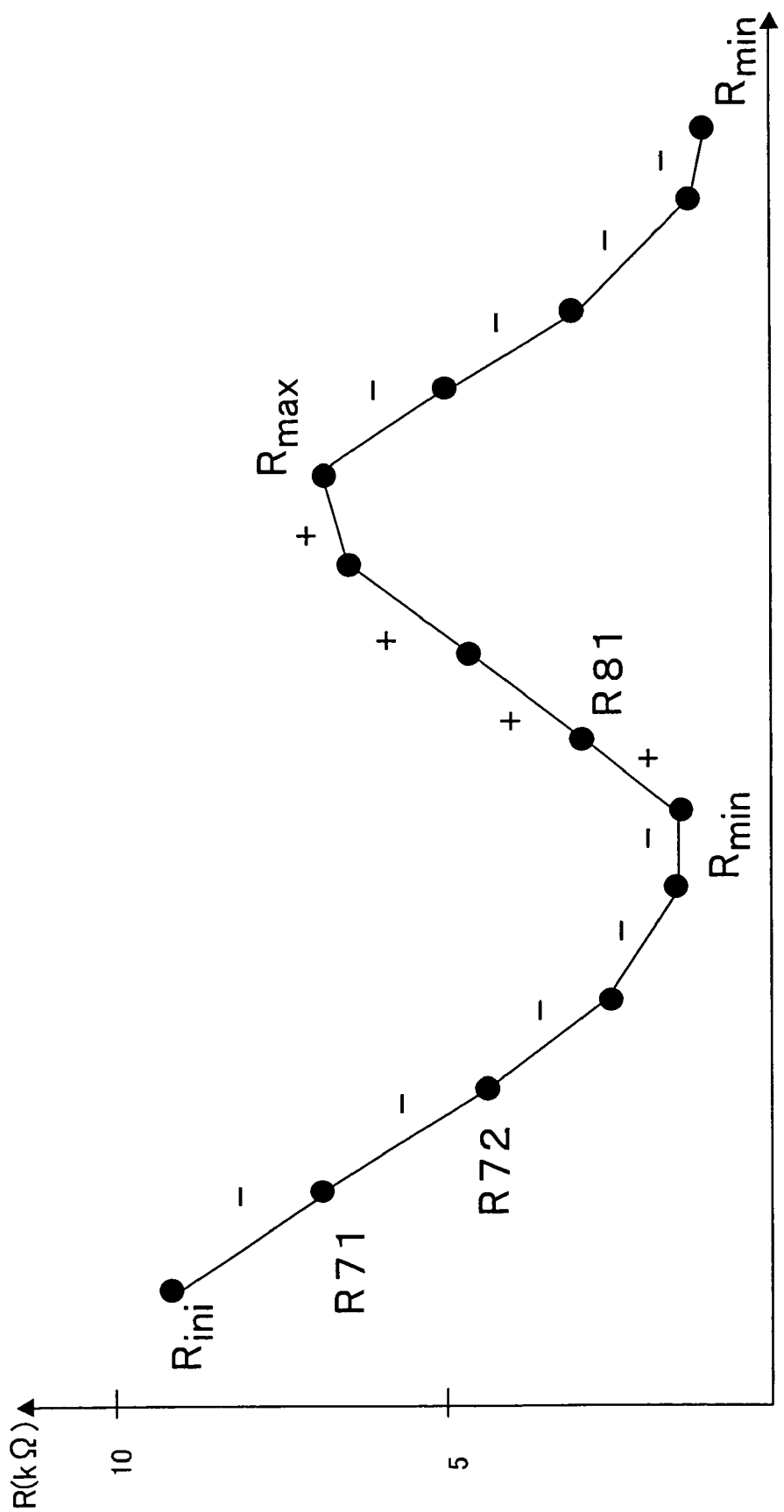
FIG. 9 shows an example of resistance variation which occurs according to electric pulses.

In the first place, an electric pulse P71 shown in FIG. 8 is applied to another sample prepared in the same way as described with FIG. 1 such that the upper electrode 1 becomes negative. The voltage of the pulse P71 is −4 V. The pulse width of the pulse P71 is 100 ms. As shown in FIG. 9, after the application of the electric pulse P71, the resistance value of the variable-resistance material film 2 decreases from initial value $R_{ini}$ to $R_{71}$.

Then, an electric pulse P72 of the same polarity (see FIG. 8) is applied to the sample, so that the resistance value of the variable-resistance material film 2 further decreases from $R_{71}$ to $R_{72}$ (see FIG. 9).

An electric pulse having the same polarity as those of the pulses P71 and P72 is applied a plurality of times, so that the resistance value of the variable-resistance material film 2 further decreases. However, after the number of times of application exceeds a certain number, the decrease of the resistance value becomes saturated, and the resistance value does not become substantially smaller than minimum value $R_{min}$ (see FIG. 9).

Then, an electric pulse P81 shown in FIG. 8 is applied between the electrodes 1 and 3 such that the upper electrode 1 becomes positive. As a result, the resistance value of the variable-resistance material film 2 increases from $R_{min}$ to $R_{81}$.

By further applying electric pulses such that the upper electrode 1 becomes positive, the resistance value of the variable-resistance material film 2 continues to increase. However, after the number of times of application exceeds a certain number, the increase of the resistance value becomes saturated, and the resistance value does not become substantially larger than maximum value $R_{max}$.

Thereafter, the resistance value of the variable-resistance material film 2 can be decreased within the range between $R_{max}$ and $R_{min}$ by applying a pulse such that the upper electrode 1 becomes negative ("−") and can be increased within the range between $R_{max}$ and $R_{min}$ by applying a pulse such that the upper electrode 1 becomes positive ("+").

<Fifth Method for Initializing Variable-Resistance Material>

Figure 10:
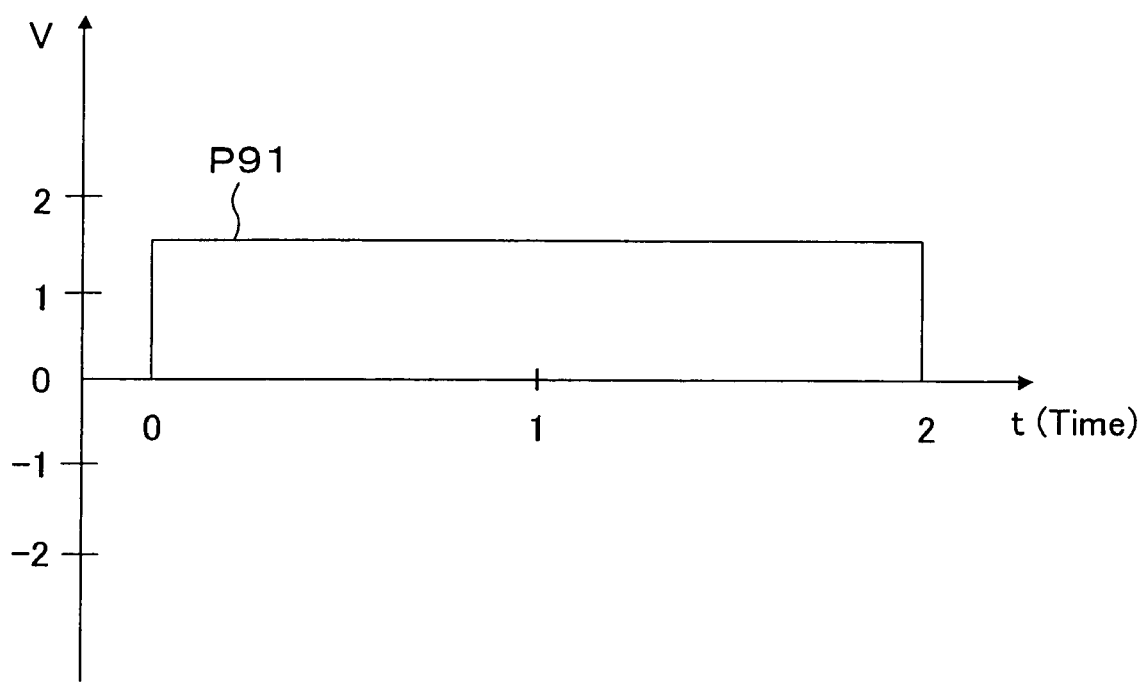
FIG. 10 shows an example of electric pulses for initialization.
Figure 11:
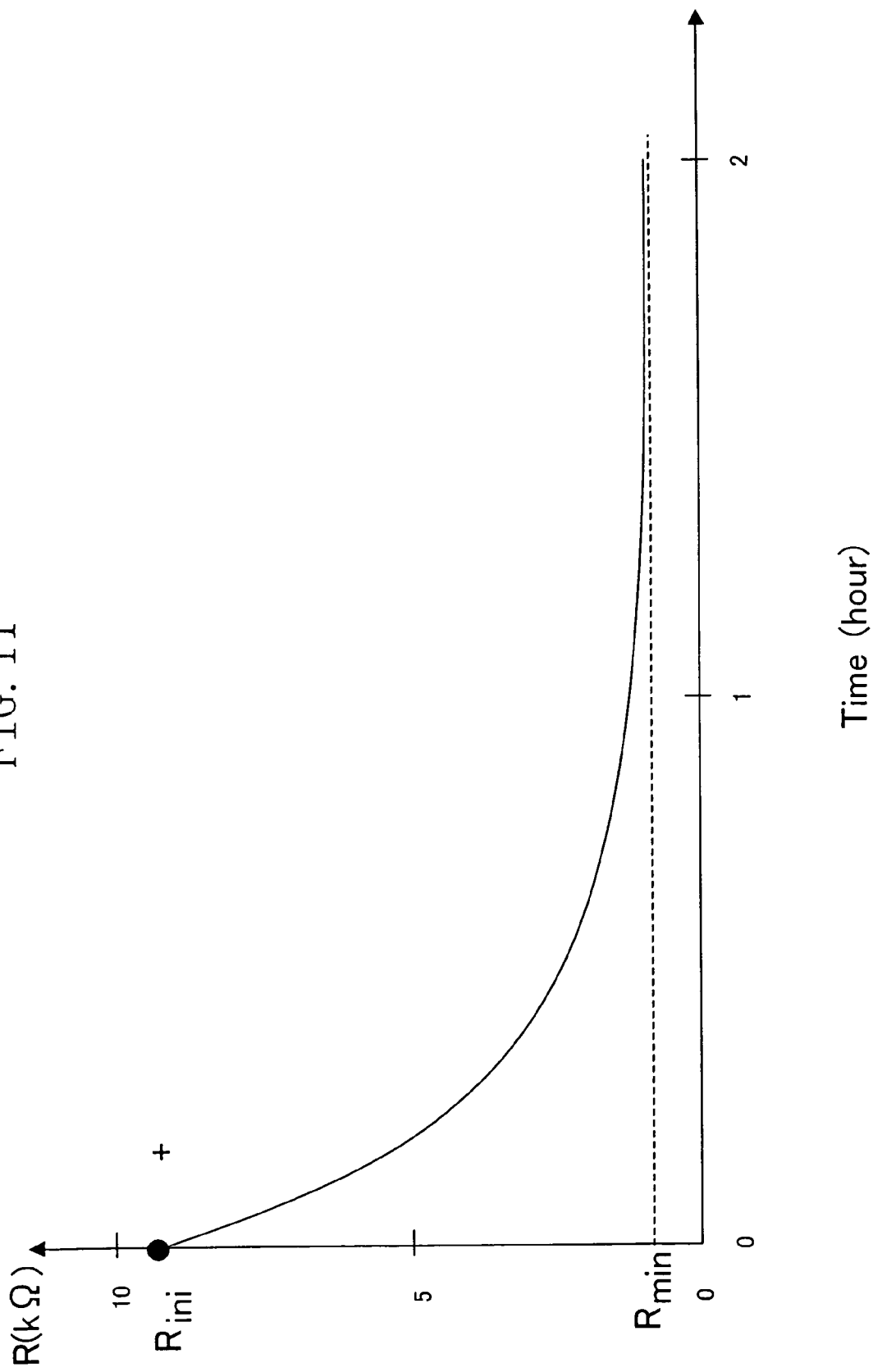
FIG. 11 shows an example of resistance variation which occurs according to electric pulses.

In the first place, a voltage P91 shown in FIG. 10 is applied between the electrodes 1 and 3 shown in FIG. 1 such that the upper electrode 1 becomes positive (the potential of the electrode 1 is higher than that of the electrode 3). The voltage P91 is +1.6 V. The application of the voltage P91 endures for 2 hours. The resistance value of the variable-resistance material film 2 gradually decreases from initial value $R_{ini}$ with the passage of time. FIG. 11 shows the time dependence of the resistance value. It should be noted that in FIG. 11 the symbol "+" means that the voltage is applied such that the electrode 1 becomes positive.

After a certain time point is passed, the decrease of the resistance value becomes saturated (the variation rate of the resistance value becomes smaller than a predetermined value), and the resistance value does not become substantially smaller than minimum value $R_{min}$ (see FIG. 11).

Figure 12:
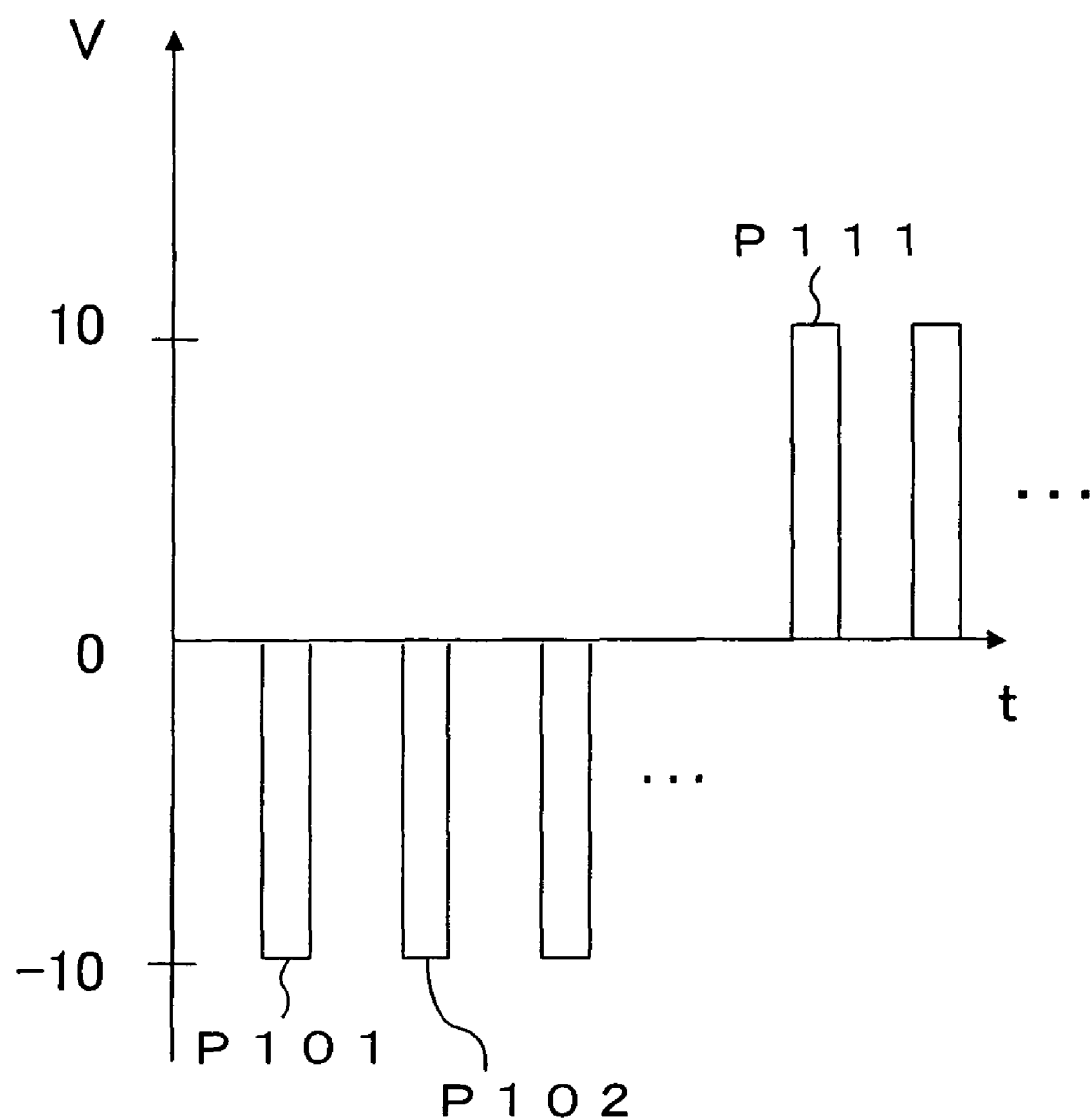
FIG. 12 shows an example of electric pulses applied to a variable-resistance material.
Figure 13:
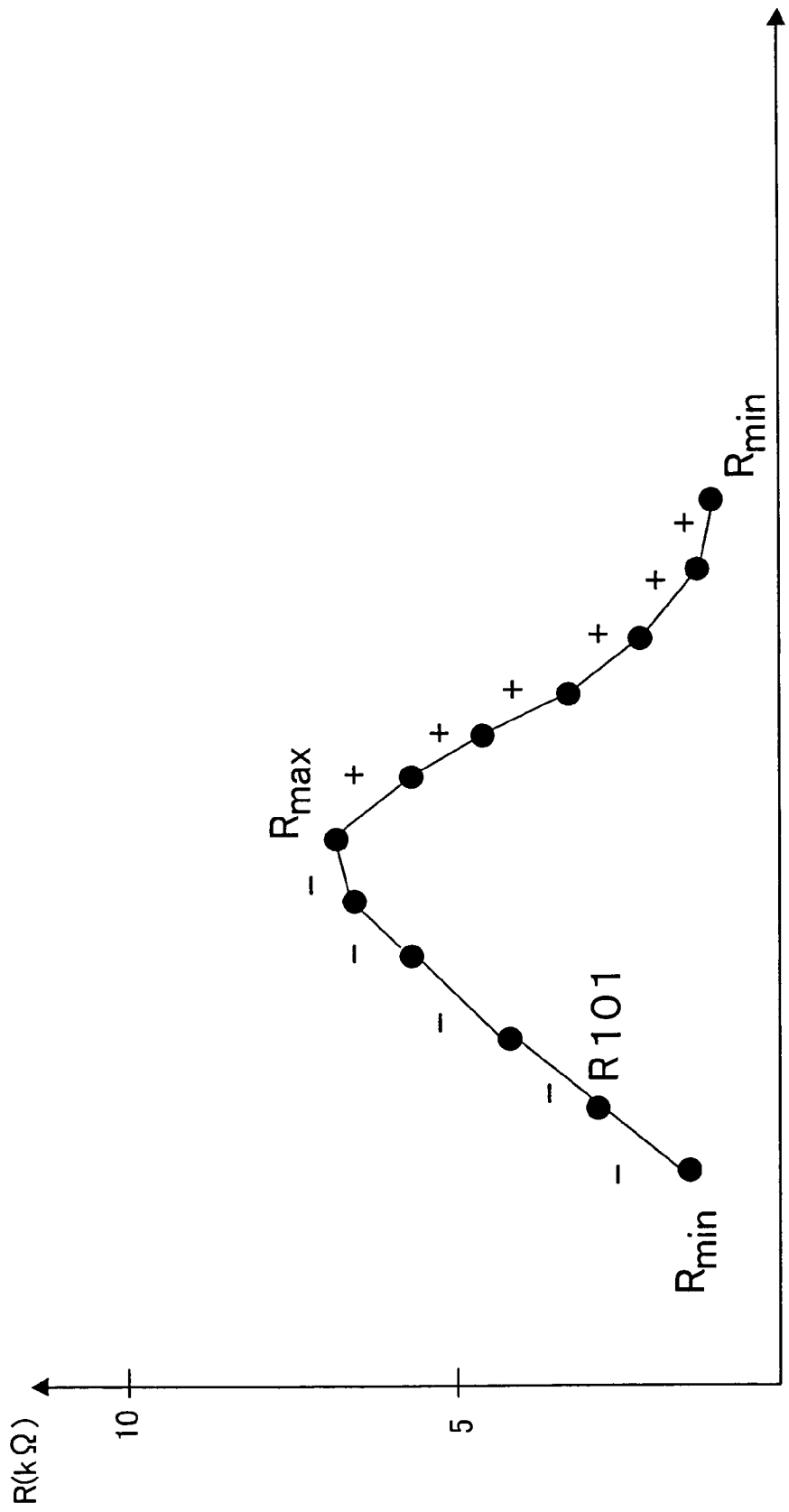
FIG. 13 shows an example of resistance variation which occurs according to electric pulses.

Then, an electric pulse P101 shown in FIG. 12 is applied between the electrodes 1 and 3 shown in FIG. 1 such that the upper electrode 1 becomes negative (the potential of the electrode 1 is lower than that of the electrode 3). The voltage of the pulse P101 is −10 V. The pulse width of the pulse P101 is 1 μs. The resistance value of the variable-resistance material film 2 increases from $R_{min}$ to $R_{101}$ (see FIG. 13).

By further applying electric pulses such that the upper electrode 1 becomes negative, the resistance value of the variable-resistance material film 2 continues to increase. However, after the number of times of application exceeds a certain number, the increase of the resistance value becomes saturated (the variation rate of the resistance value becomes smaller than a predetermined value), and the resistance value does not become substantially larger than maximum value $R_{max}$.

Thereafter, the resistance value of the variable-resistance material film 2 can be decreased within the range between $R_{max}$ and $R_{min}$ by applying a pulse such that the upper electrode 1 becomes positive ("+") and can be increased within the range between $R_{max}$ and $R_{min}$ by applying a pulse such that the upper electrode 1 becomes negative ("−").

<Sixth Method for Initializing Variable-Resistance Material>

Figure 14:
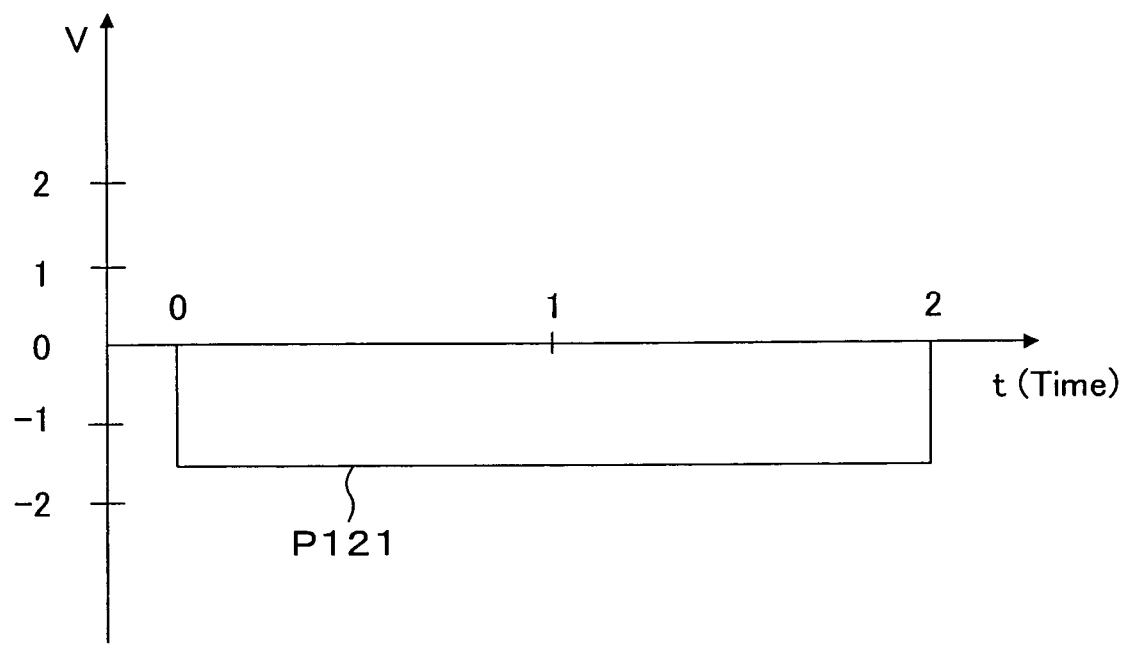
FIG. 14 shows an example of electric pulses for initialization.
Figure 15:
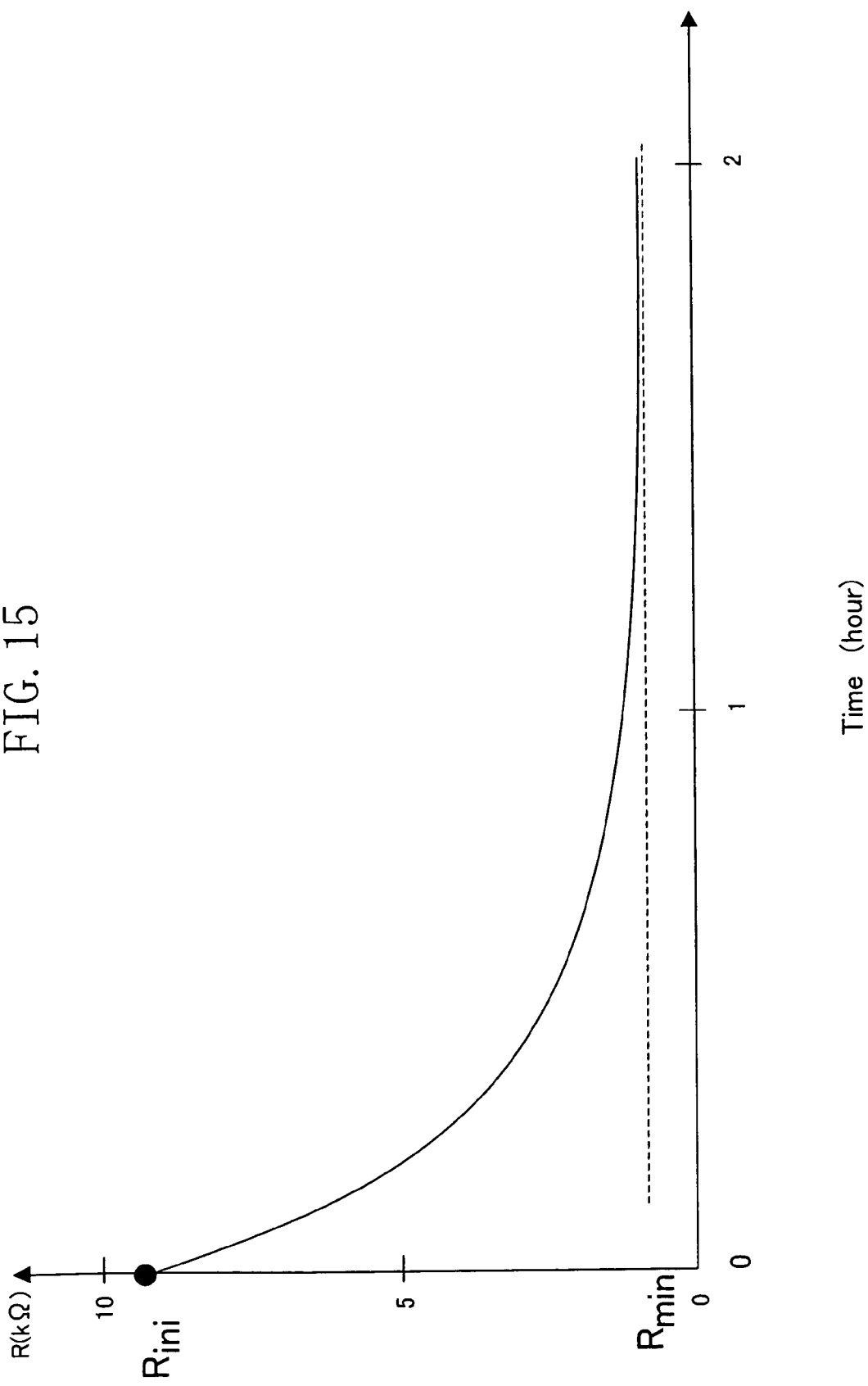
FIG. 15 shows an example of resistance variation which occurs according to electric pulses.

In the first place, a voltage P121 shown in FIG. 14 is applied between the electrodes 1 and 3 shown in FIG. 1 such that the upper electrode 1 becomes negative (the potential of the electrode 1 is lower than that of the electrode 3). The voltage P121 is −1.6 V. The application of voltage P121 endures for 2 hours. The resistance value of the variable-resistance material film 2 gradually decreases from initial value $R_{ini}$ with the passage of time. FIG. 15 shows the time dependence of the resistance value. It should be noted that in FIG. 11 the symbol "−" means that an electric pulse is applied such that the electrode 1 becomes negative.

After a certain time point is passed, the decrease of the resistance value becomes saturated (the variation rate of the resistance value becomes smaller than a predetermined value), and the resistance value does not become substantially smaller than minimum value $R_{min}$ (see FIG. 15).

Figure 16:
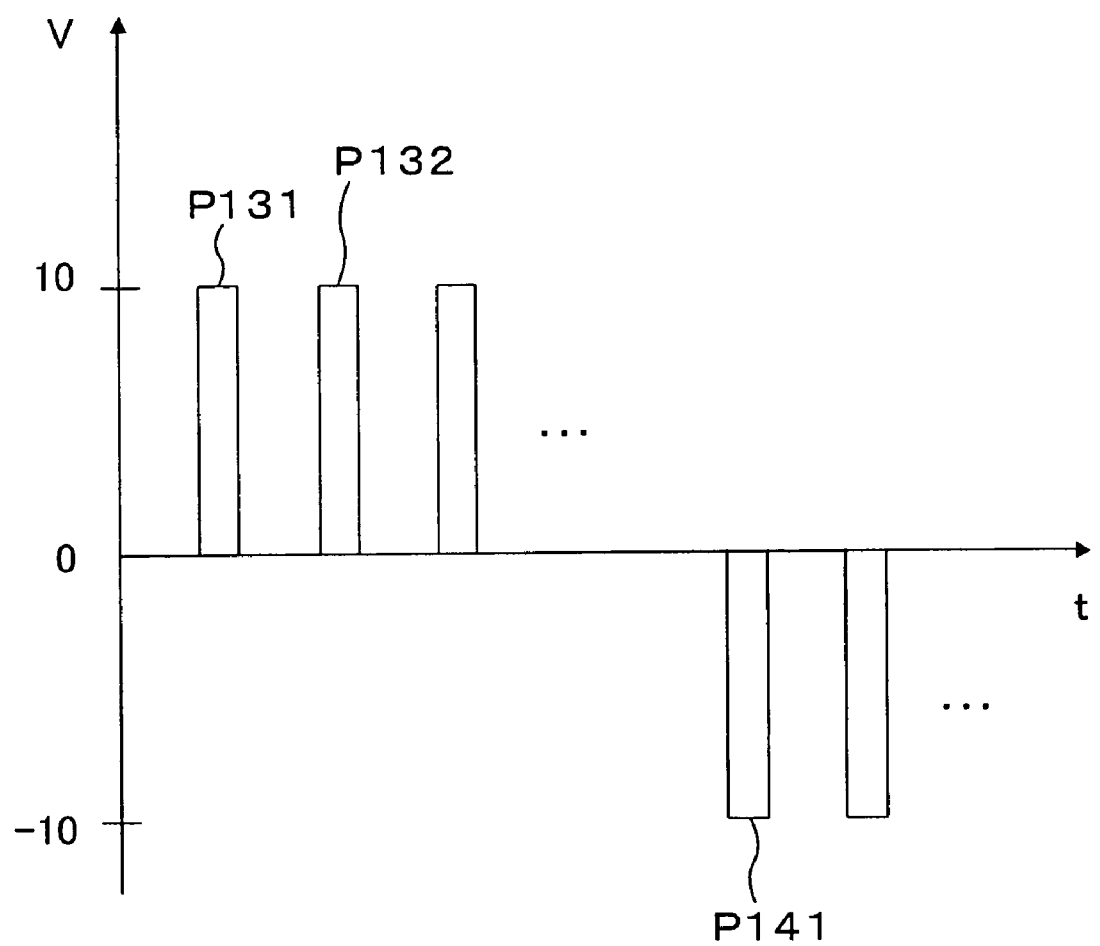
FIG. 16 shows an example of electric pulses applied to a variable-resistance material.
Figure 17:
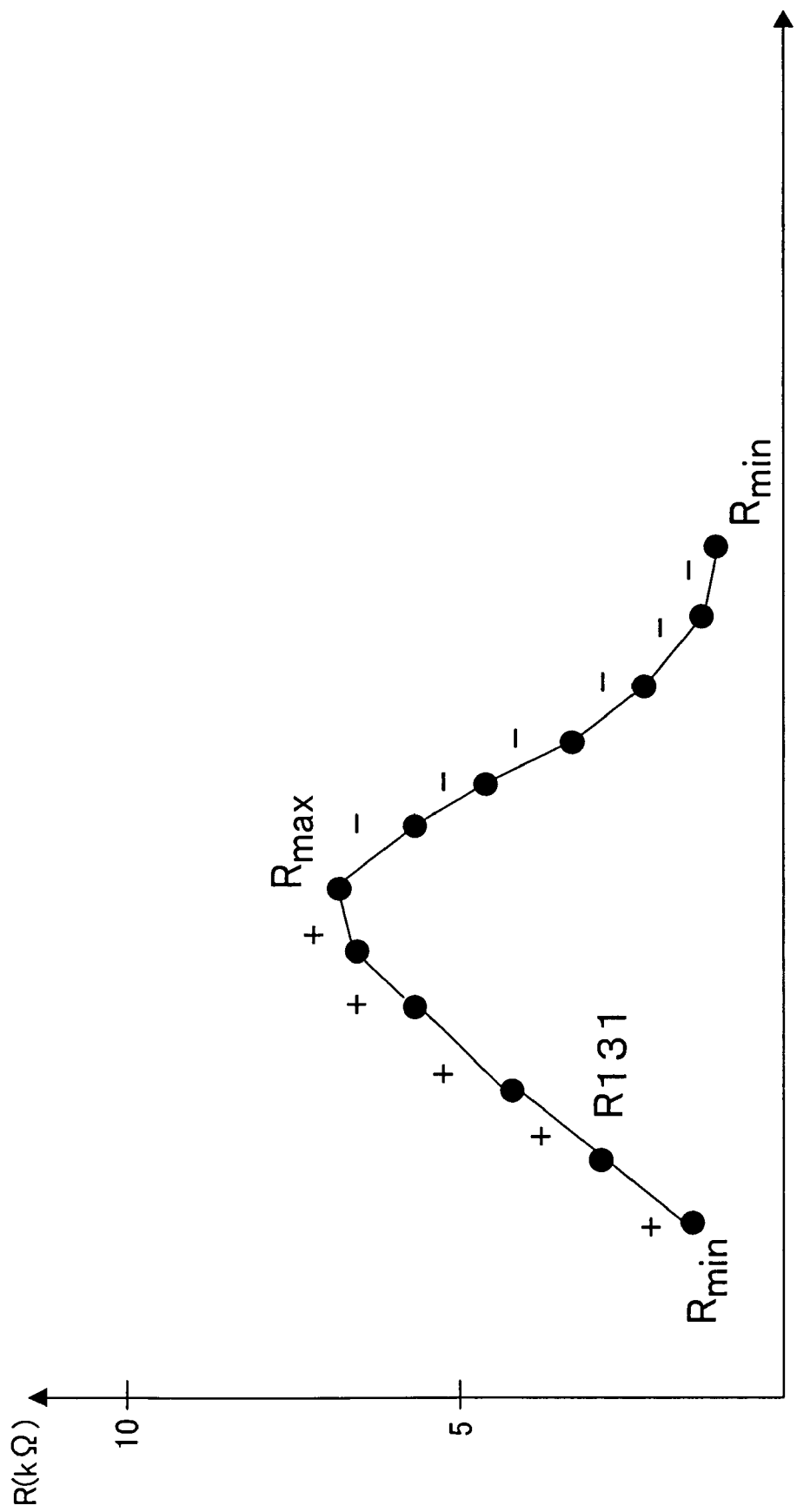
FIG. 17 shows an example of resistance variation which occurs according to electric pulses.
Figure 19:
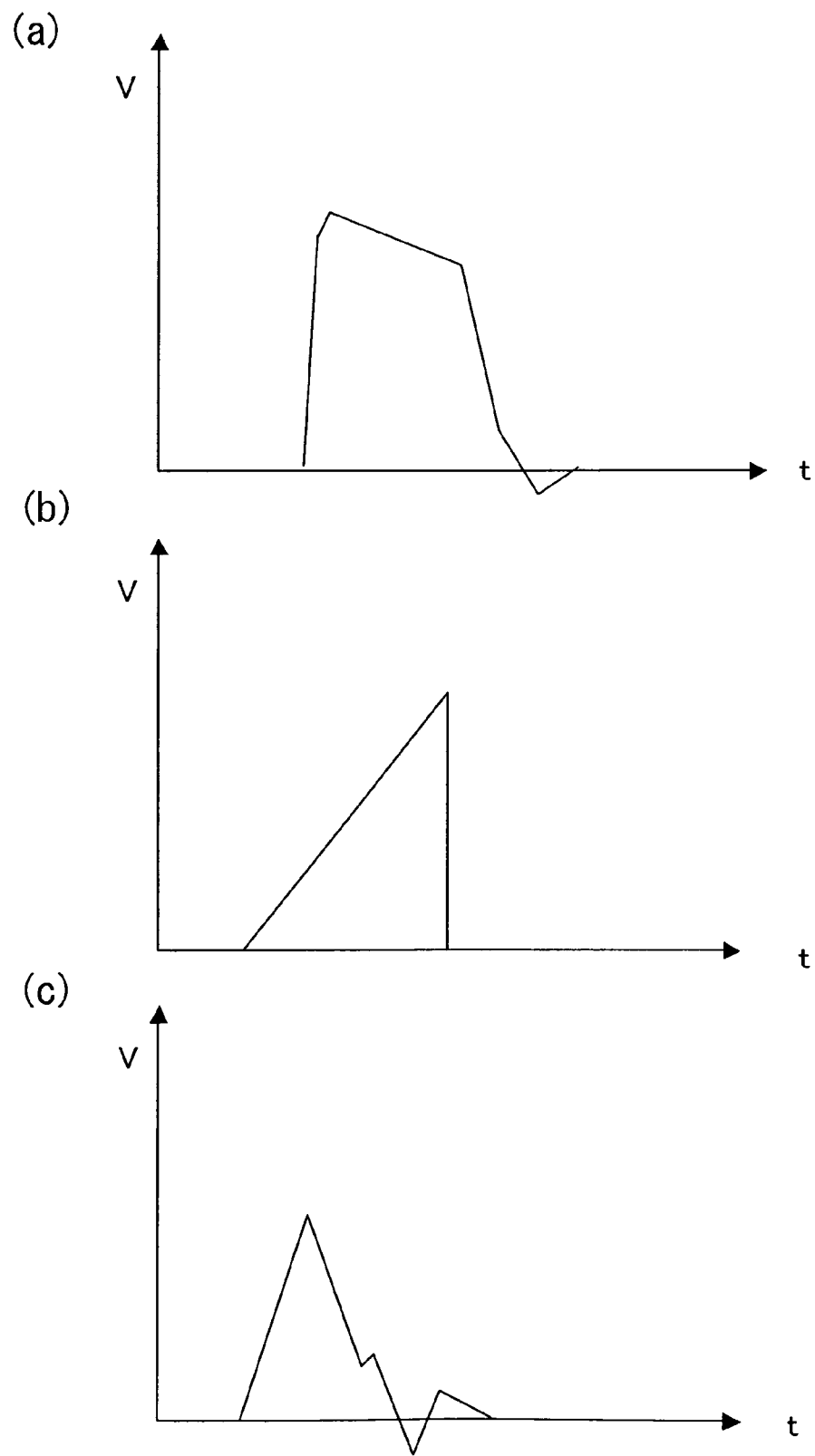
FIG. 19 shows examples of the shape of an electric pulse.

Then, an electric pulse P131 shown in FIG. 16 is applied between the electrodes 1 and 3 shown in FIG. 1 such that the upper electrode 1 becomes positive (the potential of the electrode 1 is higher than that of the electrode 3). The voltage of the pulse P131 is 10 V. The pulse width of the pulse P131 is 1 μs. The resistance value of the variable-resistance material film 2 increases from $R_{min}$ to $R_{131}$ as shown in FIG. 17.

By further applying electric pulses such that the upper electrode 1 becomes positive, the resistance value of the variable-resistance material film 2 continues to increase. However, after the number of times of application exceeds a certain number, the increase of the resistance value becomes saturated, and the resistance value does not become substantially larger than maximum value $R_{max}$.

Thereafter, the resistance value of the variable-resistance material film 2 can be decreased within the range between $R_{max}$ and $R_{min}$ by applying a pulse such that the upper electrode 1 becomes negative ("−") and can be increased within the range between $R_{max}$ and $R_{min}$ by applying a pulse such that the upper electrode 1 becomes positive ("+").

The electric pulse used in embodiment 1 is a rectangular wave as shown in FIG. 18A. However, the above-described effects of the present invention are achieved even when a triangular wave, a sine wave, a sawtooth wave, or the like, (see FIGS. 18B, 18C, and 19A to 19C) is used.

<Effects>

In the variable-resistance material film 2 used in embodiment 1, when the first electric pulse is applied between the electrodes 1 and 3 of the variable-resistance material film 2 which is in the initial state (state where an electric pulse is not yet applied between the electrodes 1 and 3 after the formation of the film 2 and the resistance value is $R_{ini}$) as illustrated with, e.g., FIG. 3 or FIG. 5, the resistance value of the variable-resistance material film 2 decreases irrespective of the polarity of the applied electric pulse. Then, when an electric pulse having the same polarity as that of the first applied electric pulse is applied between the electrodes 1 and 3, the resistance value of the variable-resistance material film 2 decreases. When an electric pulse having the opposite polarity to that of the first applied electric pulse is applied between the electrodes 1 and 3, the resistance value of the variable-resistance material film 2 increases. Thus, the relationship between a subsequently-applied electric pulse and the increase/decrease of the resistance value is determined according to the polarity of the first electric pulse applied to the variable-resistance material film 2. That is, when the polarity of the subsequently-applied electric pulse is the same as that of the first applied electric pulse, the resistance value of the variable-resistance material film 2 decreases. When the polarity of the subsequently-applied electric pulse is opposite to that of the first applied electric pulse, the resistance value of the variable-resistance material film 2 increases. In order to form a memory device by utilizing a characteristics that the resistance value of the variable-resistance material is retained, it has to be uniquely determined whether the resistance value of the variable-resistance material is increased or decreased by an electric pulse having a predetermined polarity. To this end, an electric pulse for initialization which has a specific polarity is applied to the variable-resistance material which is a component of the memory device as described in embodiment 1, whereby the polarity of the electric pulse which increases or decreases the resistance value for recording can be uniquely determined.

Embodiment 2

Figure 20:
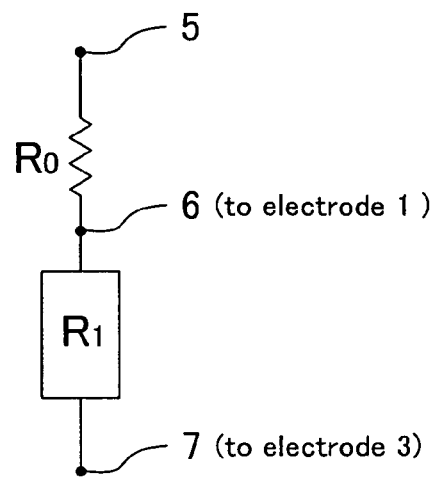
FIG. 20 shows an example of a structure of a memory device formed using a variable-resistance material.

FIG. 20 shows an example of a specific structure of a memory device which is formed using a variable-resistance material as described in embodiment 1. The memory device shown in FIG. 20 includes a fixed resistor R0 whose resistance does not change and a resistor R1 made of a variable-resistance material (see FIG. 1) which is connected in series to the fixed resistor R0. A terminal 6 of FIG. 20 is connected to the electrode 1 of FIG. 1. A terminal 7 of FIG. 20 is connected to the electrode 3 of FIG. 1.

The resistor R1 of the memory device is initialized using the second initialization method described in embodiment 1. In this case, when an electric pulse is applied between the terminal 6 and the terminal 7 such that the terminal 6 is positive with respect to the terminal 7, the resistance value of the resistor R1 increases. When an electric pulse is applied between the terminal 6 and the terminal 7 such that the terminal 6 is negative with respect to the terminal 7, the resistance value of the resistor R1 decreases.

Figure 21:
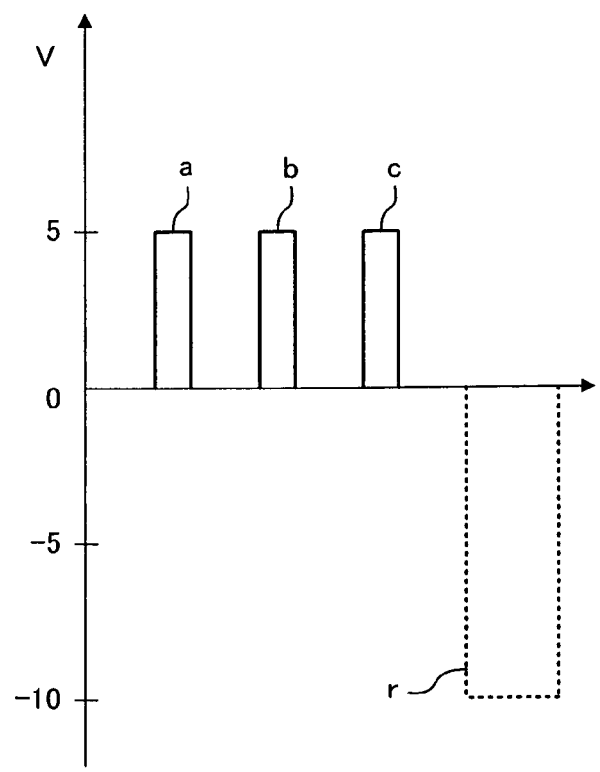
FIG. 21 shows an example of electric pulses for recording.
Figure 22:
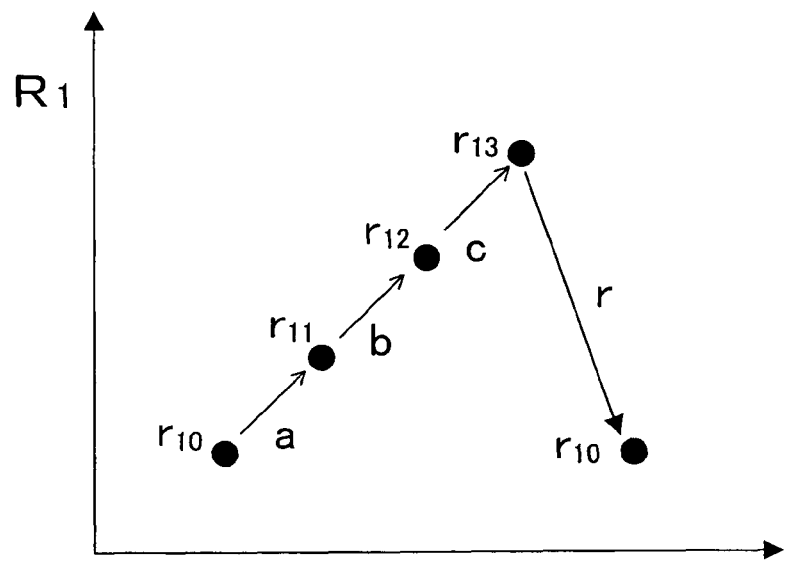
FIG. 22 shows a variation in the resistance of a resistance-variable portion of the memory device.

Then, electric pulses as shown in FIG. 21 are applied between the terminal 6 and the terminal 7 for recording. As shown in FIG. 21, pulses a, b and c are electric pulses such that the terminal 6 becomes positive with respect to the terminal 7. Each of the pulses a, b and c has an amplitude of 5 V and a width of 20 ns. A reset pulse r is an electric pulses such that the terminal 6 becomes negative with respect to the terminal 7. The reset pulse r has an amplitude of −10 V and a width of 50 ns. In the case where the electric pulses shown in FIG. 21 are applied between the terminal 6 and the terminal 7 in the order of pulse a, pulse b, pulse c and pulse r (a→b→c→r), the resistance value of the resistor R1 changes as shown in FIG. 22, i.e., r10→r11→r12→r13→r10. The states of resistance which has respective resistance values are retained unless a new recording pulse is applied. Thus, the device of FIG. 20 operates as a nonvolatile memory device.

In the case of reading the memorized state, the terminal 7 is grounded while voltage Ecc is applied to a terminal 5, and voltage V1 at the terminal 6, which is represented by the following expression, is read:

$$V1 = Ecc \times R1 / (R0 + R1).$$

Figure 23:
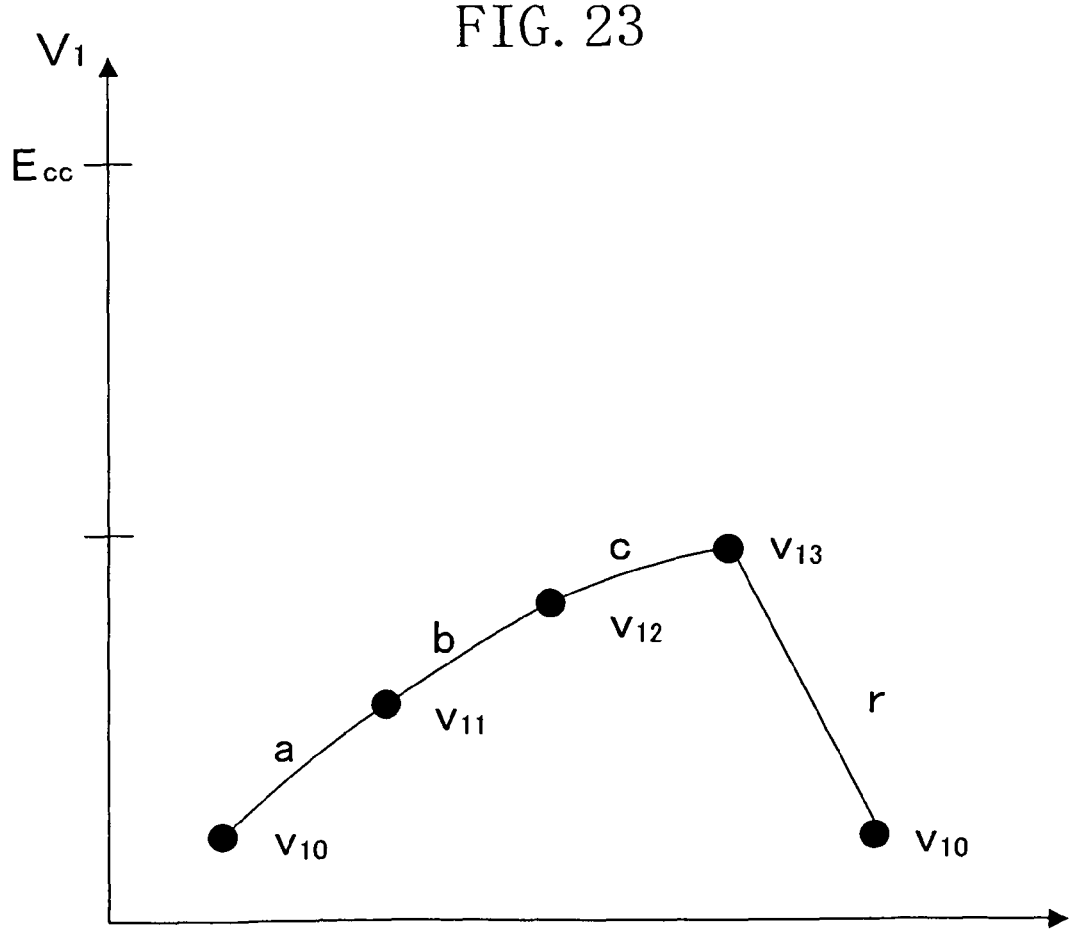
FIG. 23 shows a variation in the reading output of the memory device.

Output voltage V1 at the terminal 6 is shown in FIG. 23. In this case, it is possible to associate four different output values v10, v11, v12 and v13 with binary numbers 00, 01, 10 and 11, respectively. Voltage Ecc is set to 1.5 V because it is necessary to retain the memorized state in a reading operation.

It should be noted that an example of a 2-bit operation of the memory device has been described in embodiment 2, but the memory device can operate as a device of 1 bit or a device of 3 or more bits.

Embodiment 3

Figure 24:
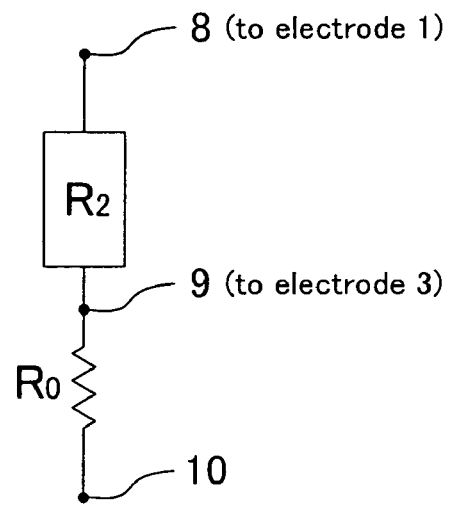
FIG. 24 shows an example of a structure of a memory device formed using a variable-resistance material.

FIG. 24 shows another example of a specific structure of a memory device which is formed using a variable-resistance material as described in embodiment 1. The memory device shown in FIG. 24 includes a fixed resistor R0 whose resistance does not change and a resistor R2 made of a variable-resistance material (see FIG. 1) which is connected in series to the fixed resistor R0. A terminal 8 of FIG. 24 is connected to the electrode 1 of FIG. 1. A terminal 9 of FIG. 24 is connected to the electrode 3 of FIG. 1.

The resistor R2 of the memory device is initialized using the first initialization method described in embodiment 1. In this case, when an electric pulse is applied between the terminal 8 and the terminal 9 such that the terminal 8 is negative with respect to the terminal 9, the resistance value of the resistor R2 increases. When an electric pulse is applied between the terminal 8 and the terminal 9 such that the terminal 8 is positive with respect to the terminal 9, the resistance value of the resistor R2 decreases.

Figure 25:
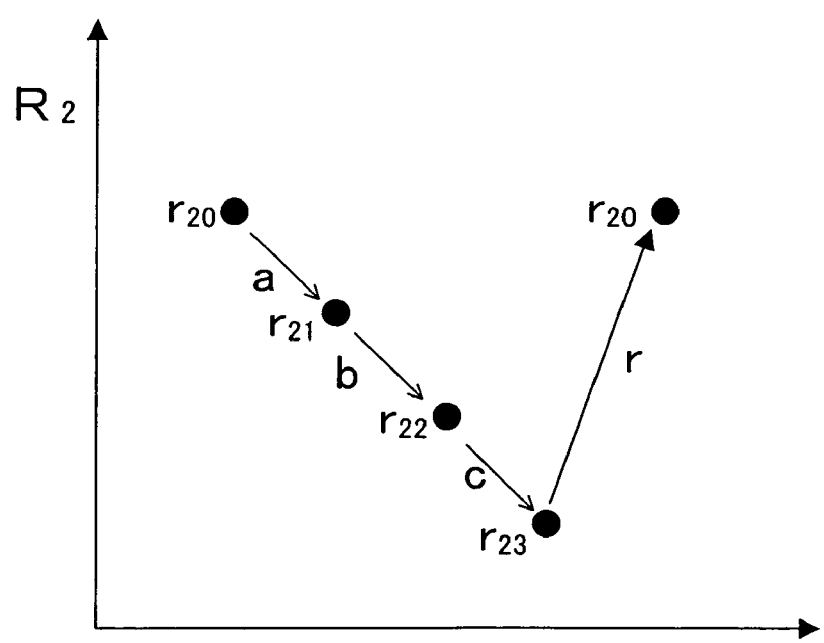
FIG. 25 shows a variation in the resistance of a resistance-variable portion of the memory device.

Then, electric pulses as shown in FIG. 21 are applied between the terminal 8 and the terminal 9 for recording. As shown in FIG. 21, pulses a, b and c are electric pulses such that the terminal 8 becomes positive with respect to the terminal 9. Each of the pulses a, b and c has an amplitude of 5 V and a width of 20 ns. A reset pulse r is an electric pulses such that the terminal 8 becomes negative with respect to the terminal 9. The reset pulse r has an amplitude of −10 V and a width of 50 ns. In the case where the electric pulses shown in FIG. 21 are applied between the terminals 8 and 9 in the order of pulse a, pulse b, pulse c and pulse r (a→b→c→r), the resistance value of the resistor R2 changes as shown in FIG. 25, i.e., r20→r21→r22→r23→r20. The states of resistance which has respective resistance values are retained unless a new recording pulse is applied. Thus, the device of FIG. 24 operates as a nonvolatile memory device.

In the case of reading the memorized state, a terminal 10 is grounded while voltage Ecc is applied to a terminal 8, and voltage V2 at the terminal 9, which is represented by the following expression, is read:

$$V2 = Ecc \times R0 / (R0 + R2).$$

Figure 26:
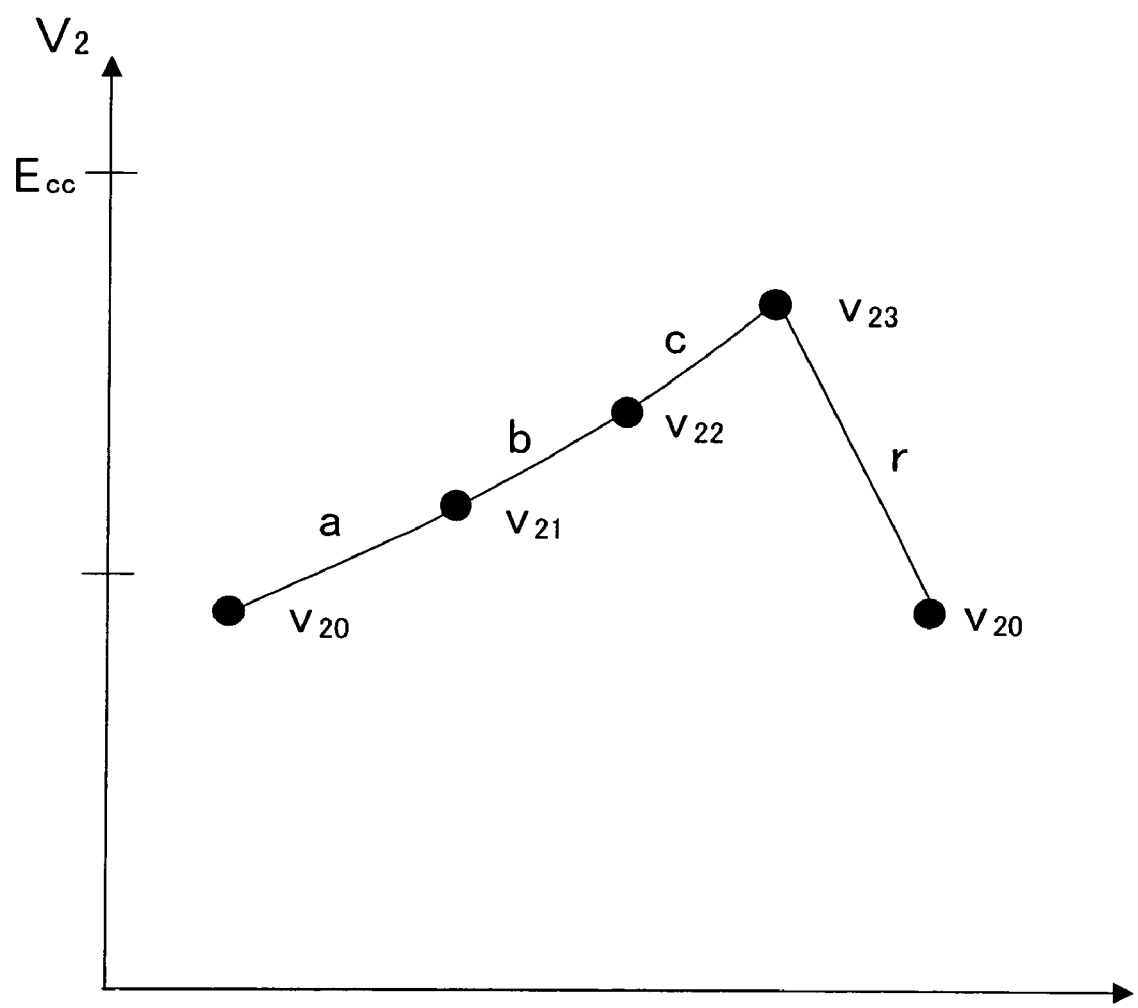
FIG. 26 shows a variation in the reading output of the memory device.

Output voltage V2 at the terminal 9 is shown in FIG. 26. In this case, it is possible to associate four different output values v20, v21, v22 and v23 with binary numbers 00, 01, 10 and 11, respectively. Voltage Ecc is set to 1.5 V because it is necessary to retain the memorized state in a reading operation.

It should be noted that an example of a 2-bit operation of the memory device has been described in embodiment 3, but the memory device can operate as a device of 1 bit or a device of 3 or more bits.

Embodiment 4

Figure 27:
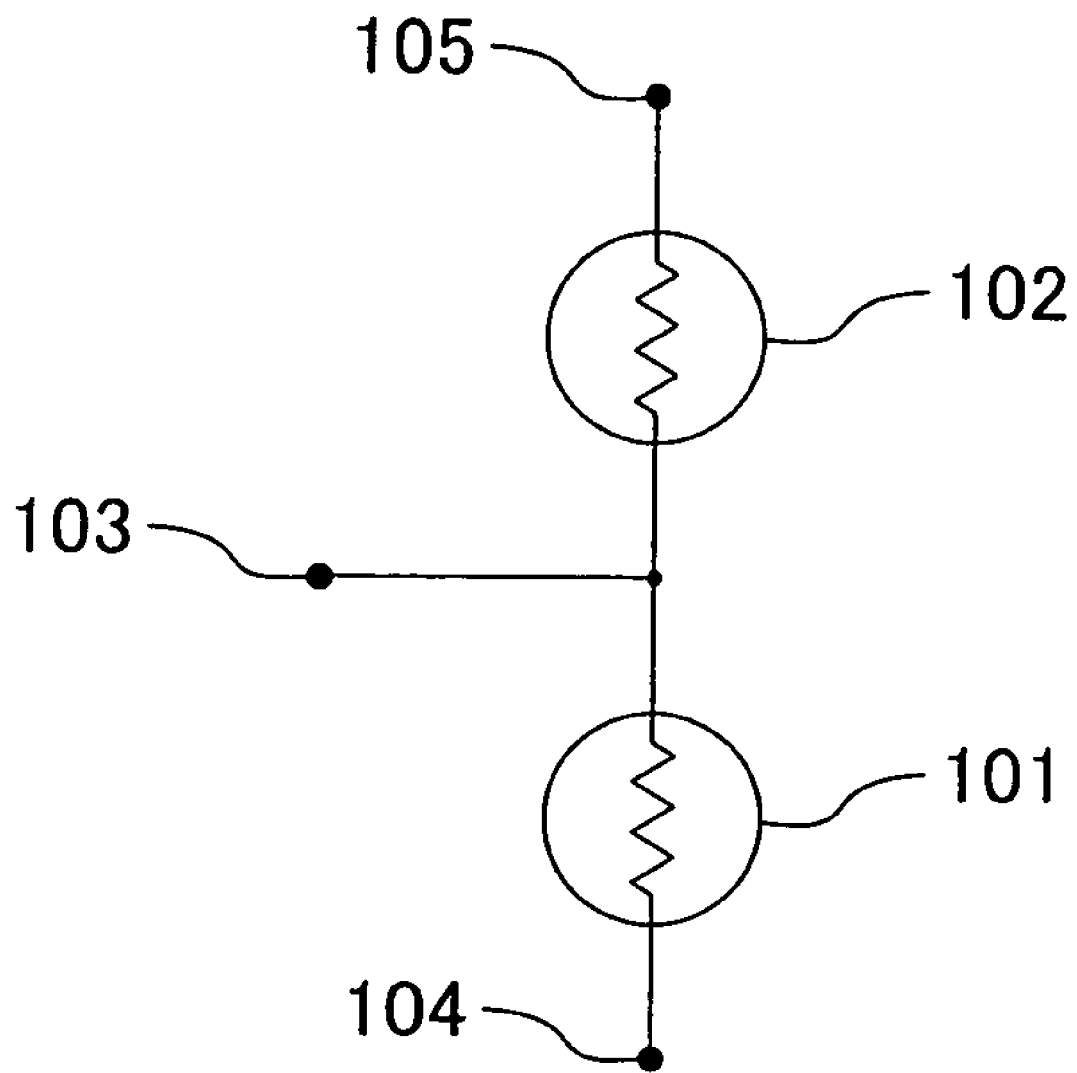
FIG. 27 shows a structure of a memory circuit to be initialized according to an embodiment of the present invention.

FIG. 27 shows an example of a structure of a memory cell circuit wherein variable resistors 101 and 102 whose resistance values change according to the polarity of an applied electric pulse are connected in series, the both ends of the variable resistors are power supply terminals 104 and 105, and an input/output terminal 103 is provided at the midpoint of the serially connected variable resistors.

In the example described herein, a CMR material of Pr0.7Ca0.3MnO3 (PCMO) is used as a material of the variable resistors 101 and 102. The PCMO material have a resistance value which changes depending on the number of applied pulses, and the direction of the change (increase or decrease) differs according to the polarity of the applied voltage as disclosed in U.S. Pat. No. 6,204,139. However, U.S. Pat. No. 6,204,139 fails to disclose an initialization method of the resistance value of the PCMO material. We examined the dependence of the resistance variation on the number of pulses when pulse voltages having different polarities are applied to the PCMO material film formed by sputtering on a substrate heated to 700° C. and studied a method for initializing the resistance value of a variable resistor in a memory circuit having a structure of the present invention wherein the two variable resistors are connected in series.

Each of the variable resistors 101 and 102 of FIG. 27 has a structure shown in FIG. 28A. Each of the variable resistors 101 and 102 includes a substrate 112, a lower electrode 114 formed over the substrate 112, a PCMO material film 111 formed on the lower electrode 114, and an upper electrode 113 formed on the PCMO material film 111. FIG. 28B shows a variation of the resistance which occurs when a pulse voltage of the negative polarity (−2 V) is first applied from the power supply 115 onto the surface of the PCMO material film 111 after the formation of the film 111. It should be noted that application of a pulse voltage between the upper electrode 113 and the lower electrode 114 such that the upper electrode 113 becomes negative is defined as application of a pulse voltage of the negative polarity, and application of a pulse voltage between the upper electrode 113 and the lower electrode 114 such that the upper electrode 113 becomes positive is defined as application of a pulse voltage of the positive polarity. As shown in FIG. 28B, the PCMO material film 111 first has a high resistance value of about 30 kΩ, but the resistance value gradually decreases as the number of applied pulses of the negative polarity increases. Specifically, the resistance value decreases to about 100Ω after about 29 pulses later. Thereafter, +2V pulse voltages having the opposite (positive) polarity are applied so that the resistance value gradually increases. The resistance value increases to reach 9 kΩ at the 39th pulse. Then, the polarity is inverted again, i.e., −2V pulse voltages of the negative polarity are applied, so that the resistance value again decreases accordingly. After such an initialization, the relationship between the polarity of the applied pulse voltage and the increase/decrease of the resistance value is uniquely determined. For example, after the initialization, the resistance value of a variable resistor increases when a positive pulse voltage is applied to the variable resistor, whereas the resistance value of a variable resistor decreases when a negative pulse voltage is applied to the variable resistor.

FIGS. 29A and 29B illustrates a variation of the resistance which occurs when a pulse voltage of the positive polarity (+2 V) is first applied from the power supply 115 onto the surface of the PCMO material film 111 after the formation of the film 111. As described previously, the PCMO material film 111 first has a high resistance value of about 30 kΩ, but the resistance value gradually decreases as the number of applied pulses of the positive polarity increases. Specifically, the resistance value decreases to about 100Ω after about 29 pulses later. Thereafter, −2V pulse voltages having the opposite (negative) polarity are applied so that the resistance value gradually increases. The resistance value increases to reach 9 kΩ at the 39th pulse. Then, the polarity is inverted again, i.e., +2V pulse voltages of the positive polarity are applied so that the resistance value again decreases accordingly. After such an initialization, the relationship between the polarity of the applied pulse voltage and the increase/decrease of the resistance value is uniquely determined. For example, after the initialization, the resistance value of a variable resistor increases when a negative pulse voltage is applied to the variable resistor, whereas the resistance value of a variable resistor decreases when a positive pulse voltage is applied to the variable resistor.

Figure 28:
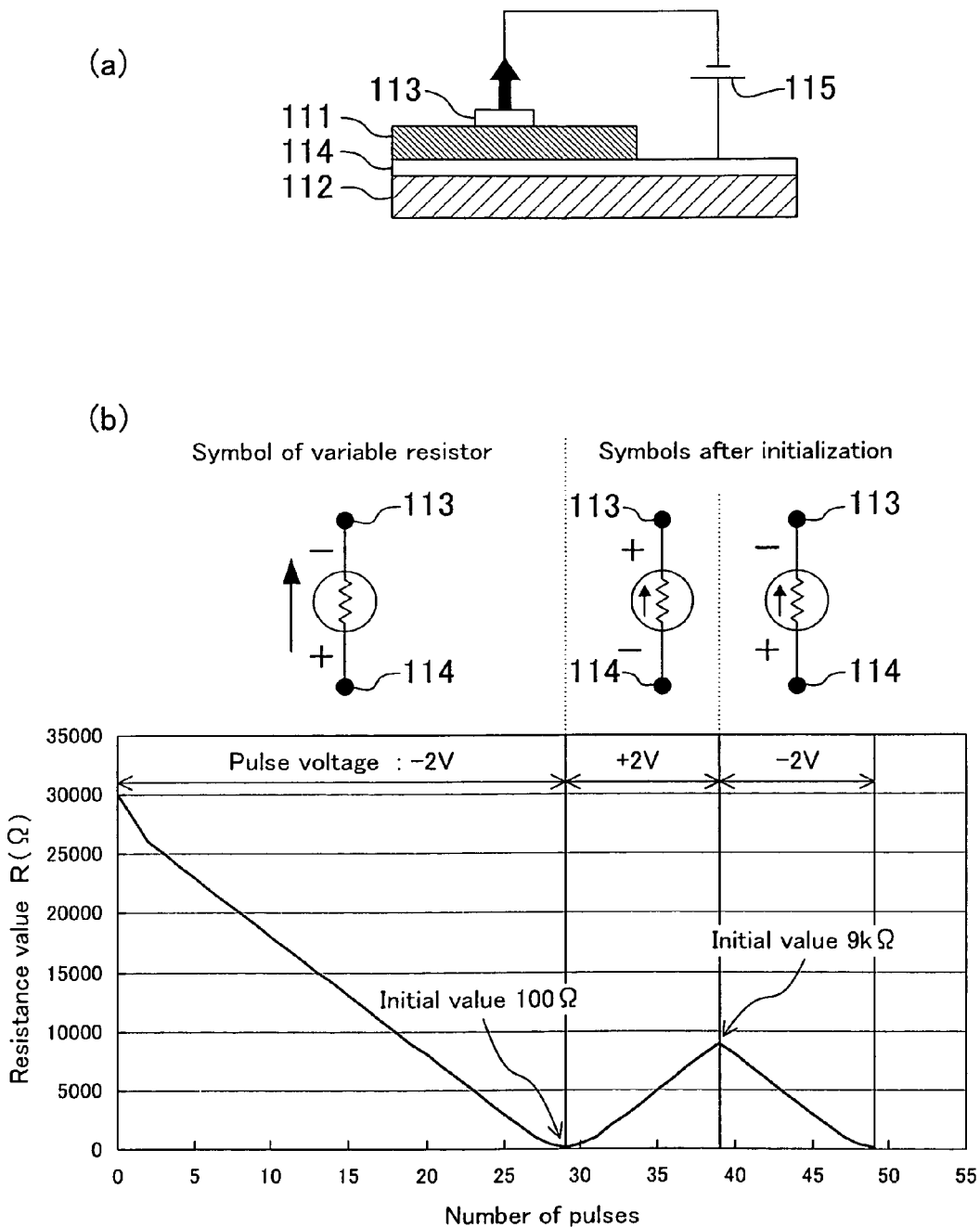
FIG. 28A shows a structure of a variable-resistor in the memory circuit shown in FIG. 27.
FIG. 28B shows a variation in the resistance value in the process of initialization with negative pulse voltages applied onto a surface of the variable-resistor shown in FIG. 28A together with the symbols of the variable-resistor after initialization.

In this example, the polarity of a pulse voltage is defined as the polarity of a voltage applied to the surface of the PCMO material film 111 for convenience of illustration. However, in description with a circuit diagram, the definitions of "front" and "back" of the film are not effective. Therefore, if the variable resistors initialized using the initialization method of the present invention are represented by circuit symbols as shown in FIGS. 28B and 29B, both the characteristics described in FIG. 28 and the characteristics described in FIG. 29 are explained at the same time. Specifically, a circuit symbol representing an initialized variable resistor is defined in such a manner that the resistance value increases when a positive pulse voltage is applied to the tip of the arrow and the resistance value decreases when a negative pulse voltage is applied to the tip of the arrow. With this definition, the variable resistor initialized using the method described with FIG. 28 and the variable resistor initialized using the method described with FIG. 29 are represented by the same symbol. Thus, in this specification, the variable resistors initialized using the method of the present invention are each represented by the symbol shown in FIGS. 28 and 29.

Next, a method for initializing a memory circuit according to embodiment 4 is described. A memory circuit to be initialized has a structure shown in FIGS. 27 and 30 wherein variable resistors 101 and 102 whose resistance values change according to an electric pulse are connected in series between power supply terminals 104 and 105, and an input/output terminal 103 is provided at a midpoint between the variable resistors 101 and 102.

At the first step of the initialization method, a +2 V pulse voltage and a −2 V pulse voltage are applied to the power supply terminal 104 and the power supply terminal 105, respectively, while the input/output terminal 103 is connected to ground GND as shown in Step 1 of FIG. 30A. As a result, pulse voltages of the same polarity are applied to the variable resistors 101 and 102 so that the resistance values of the variable resistors 101 and 102 gradually decrease in the same fashion as shown in the period of "Step 1" of FIG. 30B.

Thereafter, as shown in the period of "Step 2" of FIG. 30B, a pulse voltage of the opposite polarity, a +2 V pulse voltage, is applied to the power supply terminal 105 while the power supply terminal 104 is grounded. Accordingly, a pulse voltage of the opposite polarity to that applied at Step 1 is applied to only the variable resistor 102 so that the resistance value of the variable resistor 102 increases. As a result, the resistance values of the two variable resistors 101 and 102 are initialized to the two states, a low value (Low) and a high value (High). In this example, the variable resistor 101 is initialized to the low value, and the variable resistor 102 is initialized to the high value.

In the memory circuit including the thus-initialized variable resistors 101 and 102, when +2 V (+ECC) pulse voltages (recording pulses) are applied to the input/output terminal 103 while the power supply terminals 104 and 105 are connected to ground GND as shown in FIG. 31A, a complementary change occurs such that the resistance value of the variable resistor 101 increases while the resistance value of the variable resistor 102 decreases depending on the number of pulses.

As described above, according to embodiment 4, the resistance values of the two variable resistors 101 and 102 are changed in the directions opposite to the initial values by the application of a pulse voltage through the input/output terminal 103, whereby recording of information is achieved. Further, since the resistance value changes by about two orders of magnitude, multivalue information of multibit can be recorded. Further, in the reset operation, the value of each variable resistor can be reset to the initial value by applying to the input/output terminal 103 a reset pulse voltage having a polarity opposite to those applied in the recording operation (−2 V reset pulse in this example). In the above example, the pulse width of a pulse voltage used for initialization, recording and reset is 100 nsec. However, the above effects of the present invention are achieved even with a short pulse width of 10 nsec. In this case, the write/erase operations are achieved with very high speed.

Figure 32:
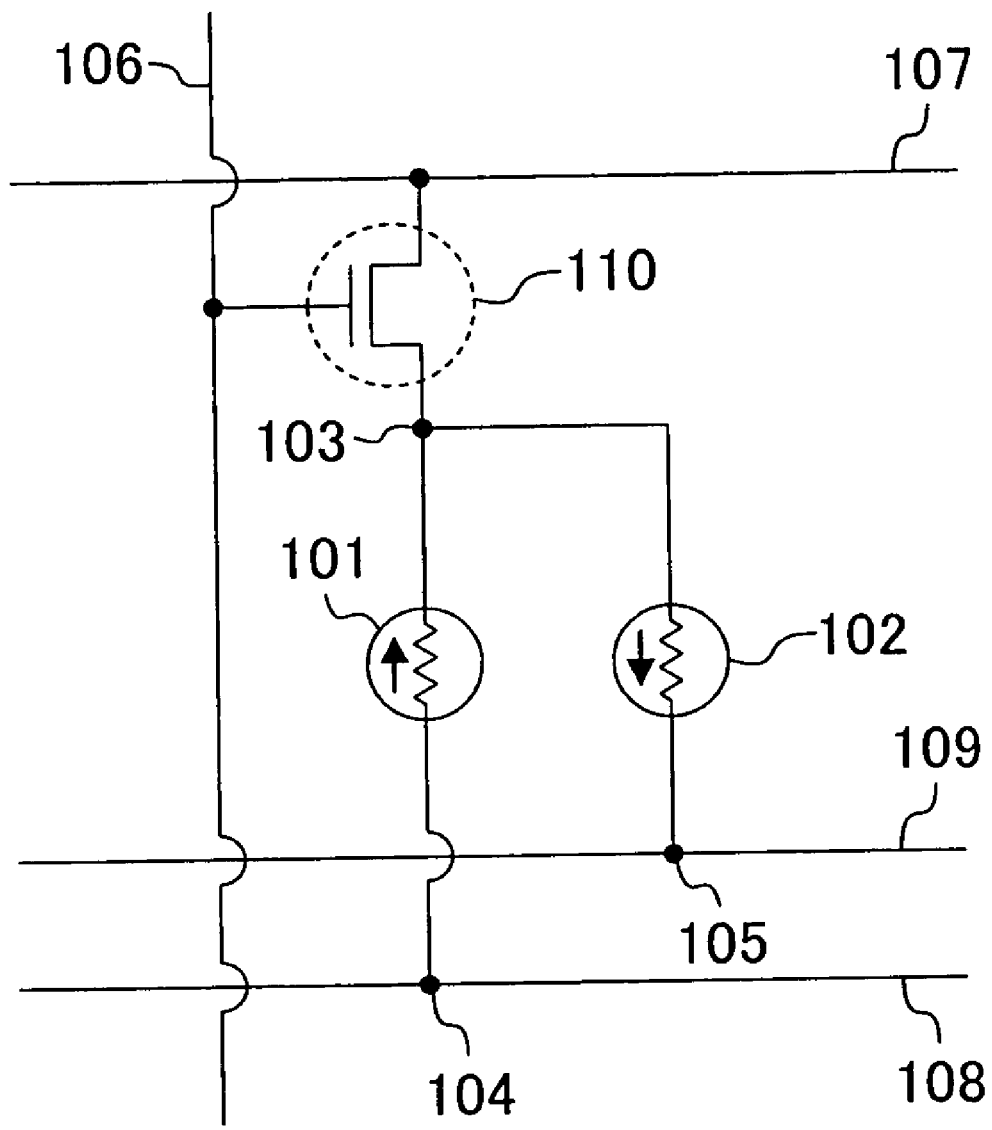
FIG. 32 shows a memory array circuit according to embodiment 3.

FIG. 32 shows an example of a memory array circuit wherein a memory circuit of embodiment 4 is incorporated in a transistor circuit. In this case, the input/output terminal 103 is connected to the drain (or source) of a transistor 110. The power supply terminal 104 is connected to a plate line 108. The power supply terminal 105 is connected to a plate line 109. The memory cell is selected by a word line 106. Information is input/output through a bit line 107.

In a method for initializing a variable resistor according to embodiment 4, all the memory cells are selected by word lines 106 while the bit lines 107 are grounded, and a +2 V pulse voltage and a −2 V pulse voltage are applied to the plate line 108 and the plate line 109, respectively, to decrease the resistance values of the two variable resistors 101 and 102. Thereafter, the plate line 108 is grounded, and a second pulse voltage having the opposite polarity to that of the first one, a +2 V pulse voltage, is applied to the plate line 109 to increase the resistance value of the variable resistor 102, whereby the initial state is determined.

After the completion of such an initialization process, in a recording operation, both the plate line 108 and the plate line 109 are grounded, and a +2 V pulse voltage is applied to a bit line. In a reproduction operation, the plate line 108 is grounded, and a +1 V voltage is applied to the plate line 109 to output a voltage of the bit line. In the reset operation, both the plate line 108 and the plate line 109 are grounded, and a −2 V pulse voltage is applied to the bit line.

FIG. 33A illustrates variations in the resistance values of the variable resistor 101 and the variable resistor 102 in a recording operation and a reset operation in the memory circuit of embodiment 4. As seen from the graph of FIG. 33A, the resistance values of the variable resistor 101 and the variable resistor 102 change complementarily according to a +2 V pulse voltage. FIG. 33B shows reproduction output voltage values which are obtained when respective recorded states are read. As seen from the graph of FIG. 33B, the level of the output voltage differs according to the number of pulses in a recording operation (recorded state), and different recorded states can be reproduced with high resolution. As a result, not only 1-bit information but also information of 2 or more bits can be recorded and reproduced. Further, the memory circuit can be reset to the initial state by applying the same number of pulse voltages having a polarity opposite to that of recording pulses.

As described above, the memory circuit of embodiment 4 has a structure that utilizes complementary variations of the resistance values of the two variable resistors. Thus, even when the degree of variation in the resistance values of the variable resistor 101 and the variable resistor 102 of another memory cell in a memory array circuit or of a memory cell circuit in another memory array circuit on a Si wafer at the time of production of the memory array circuit is decreased as shown in FIG. 34A, the output voltage which changes according to the number of recording pulses (recorded state) has substantially the same value as that obtained when the resistance variation is normal as shown in FIG. 34B. Therefore, even when the resistance variation differs among positions, different recorded states can be reproduced with high resolution. Further, the memory circuit can be reset to the initial state by applying the same number of pulse voltages having a polarity opposite to that of recording pulses.

With the above structure of embodiment 4 including two variable resistors connected in series wherein the resistance values of the resistors change complementarily, the stability of operation and production yield of a memory device, which have been significant challenges in the conventional techniques, are greatly improved.

In the above-described example of embodiment 4, in the reset operation, pulses of the same voltage as, but of the opposite polarity to, recording pulses (−2 V) are applied. However, according to the present invention, pulses of greater voltage (−5 V) may be applied. In this case, the number of reset pulses can be greatly reduced from 10 pulses to 1 pulse.

Embodiment 5

A method for initializing a memory circuit according to embodiment 5 is described. The structure of a memory circuit to be initialized is the same as that described in embodiment 4. As shown in FIGS. 27 and 35, two variable resistors 101 and 102 whose resistance values change according to an electric pulse are connected in series, the both ends of the variable resistors are power supply terminals 104 and 105, and an input/output terminal 103 is provided at the midpoint of the variable resistors 101 and 102.

At the first step of the initialization method, a −2 V pulse voltage and a +2 V pulse voltage are applied to the power supply terminal 104 and the power supply terminal 105, respectively, while the input/output terminal 103 is connected to ground GND as shown in Step 1 of FIG. 35A. Accordingly, pulse voltages of the same polarity are applied to the variable resistors 101 and 102 as shown in FIG. 35A so that the resistance values of the variable resistors 101 and 102 gradually decreases in the same fashion as shown in FIG. 35B. Thereafter, as shown in Step 2 of FIG. 35A, a pulse voltage of the opposite polarity, a −2 V pulse voltage, is applied to the power supply terminal 105 while the power supply terminal 104 is connected to ground GND. Accordingly, a pulse voltage of the opposite polarity to that applied at Step 1 is applied to only the variable resistor 102 so that the resistance value of the variable resistor 102 increases as shown in FIG. 35B. As a result, the resistance values of the two variable resistors 101 and 102 are initialized to the two states, a low value (Low) and a high value (High).

In the memory circuit including the thus-initialized variable resistors 101 and 102, when −2 V pulse voltages are applied to the input/output terminal 103 while the power supply terminals 104 and 105 are connected to ground GND, a complementary change occurs such that the resistance value of the variable resistor 101 increases while the resistance value of the variable resistor 102 decreases depending on the number of pulses. Also in embodiment 5, the resistance values of the two variable resistors 101 and 102 are changed in the directions opposite to the initial values by the application of a pulse voltage through the input/output terminal 103, whereby recording of information is achieved as in embodiment 4.

With the above structure of embodiment 5 including two variable resistors 101 and 102 connected in series wherein the resistance values of the resistors change complementarily, the stability of operation and production yield of a memory device, which have been significant challenges in the conventional techniques, are greatly improved.

Embodiment 6

A method for initializing a memory circuit according to embodiment 6 is described. The structure of a memory circuit to be initialized is the same as that described in embodiments 4 and 5. As shown in FIGS. 27 and 35, two variable resistors 101 and 102 whose resistance values change according to an electric pulse are connected in series, the both ends of the variable resistors 101 and 102 are power supply terminals 104 and 105, and an input/output terminal 103 is provided at the midpoint of the variable resistors 101 and 102.

At the first step of the initialization method, a +2 V pulse voltage is applied to the power supply terminal 104 and a pulse voltage of the same polarity, a +2 V pulse voltage, is applied to the power supply terminal 105 while the input/output terminal 103 is connected to ground GND as shown in Step 1 of FIG. 36A. Accordingly, pulse voltages of opposite polarities are applied to the variable resistors 101 and 102 as shown in Step 1 of FIG. 36A. However, the resistance values of the variable resistors 101 and 102 gradually decreases in the same fashion as shown in FIG. 36B.

Thereafter, a pulse voltage of the opposite polarity, a −2 V pulse voltage, is applied to the power supply terminal 105 while the power supply terminal 104 is connected to ground GND. Accordingly, a pulse voltage of the opposite polarity to that applied at Step 1 is applied to only the variable resistor 102 so that the resistance value of the variable resistor 102 increases. As a result, the resistance values of the two variable resistors 101 and 102 are initialized to the two states, a low value (Low) and a high value (High).

In the memory circuit including the thus-initialized variable resistors 101 and 102, as shown in FIG. 37, a recording pulse voltage which is formed by a pair of a −1 V pulse voltage and a +1 V pulse voltage is applied to the input/output terminal 103. In synchronization with the application of the recording pulse voltage to the input/output terminal 103, a pair of +1 V pulse voltages is applied to the power supply terminal 105, and a pair of −1 V pulse voltages is applied to the power supply terminal 104. Accordingly, the resistance values of the two variable resistors 101 and 102 are changed in the opposite directions as shown in FIG. 37B. Thus, the resistance values of the two variable resistors 101 and 102 are changed in the direction opposite to the initial values by the application of a pulse voltage through the input/output terminal 103, whereby recording of information is achieved. Further, since the resistance value changes by about two orders of magnitude, multivalue information of multibit can be recorded. Furthermore, in the reset operation, the value of each variable resistor can be reset to the initial value by applying to the input/output terminal 103 a reset pulse voltage which is formed by a pair of a −1 V pulse voltage and a +1 V pulse voltage. In synchronization with the application of the reset pulse voltage to the input/output terminal 103, a pair of −1 V pulse voltages is applied to the power supply terminal 105, and a pair of +1 V pulse voltages is applied to the power supply terminal 104. Accordingly, the resistance values of the two variable resistors 101 and 102 are changed in the opposite directions as shown in FIG. 37B, whereby the resistance values of the two variable resistors are reset to the initial values.

In the above example, the pulse width of a pulse voltage used for initialization, recording and reset is 100 nsec. However, the above effects of the present invention are achieved even with a short pulse width of 10 nsec. In this case, the write/erase operations are achieved with very high speed.

With the above structure of embodiment 6 including two variable resistors 101 and 102 connected in series wherein the resistance values of the resistors change complementarily, the stability of operation and production yield of a memory device, which have been significant challenges in the conventional techniques, are greatly improved.

Embodiment 7

A method for initializing a memory circuit according to embodiment 7 is described. The structure of a memory circuit to be initialized is the same as those described in embodiments 3-5. As shown in FIGS. 27 and 38, two variable resistors 101 and 102 whose resistance values change according to an electric pulse are connected in series, the both ends of the variable resistors are power supply terminals 104 and 105, and an input/output terminal 103 is provided at the midpoint of the variable resistors 101 and 102.

At the first step of the initialization method, a −2 V pulse voltage is applied to the power supply terminal 104 and a pulse voltage of the same polarity, a −2 V pulse voltage, is also applied to the power supply terminal 105 while the input/output terminal 103 is connected to ground GND as shown in Step 1 of FIG. 38A. Accordingly, pulse voltages of the same polarity are applied to the variable resistors 101 and 102 as shown in Step 1 of FIG. 38A so that the resistance values of the variable resistors 101 and 102 gradually decreases in the same fashion as shown in FIG. 38B. Thereafter, a pulse voltage of the opposite polarity, a +2 V pulse voltage, is applied to the power supply terminal 105 while the power supply terminal 104 is connected to ground GND. Accordingly, a pulse voltage of the opposite polarity to that applied at Step 1 is applied to only the variable resistor 102 so that the resistance value of the variable resistor 102 increases. As a result, the resistance values of the two variable resistors 101 and 102 are initialized to the two states, a low value (Low) and a high value (High).

Also in the memory circuit including the thus-initialized variable resistors 101 and 102, the write/erase operations are achieved with very high speed as in the circuit described in embodiment 6.

With the above structure of embodiment 7 including two variable resistors 101 and 102 connected in series wherein the resistance values of the resistors change complementarily, the stability of operation and production yield of a memory device, which have been significant challenges in the conventional techniques, are greatly improved.

INDUSTRIAL APPLICABILITY

A nonvolatile memory initialized by an initialization method of the present invention is a useful memory that can be realized as a low power, large capacity memory capable of high speed writing and erasing.

The invention claimed is:

1. A memory device comprising:
a material (variable-resistance material) whose resistance value increases/decreases according to the polarity of an applied electric pulse, and
first and second electrodes connected to the variable-resistance material,
wherein the memory device is initialized by the steps of:
(a) in an initial state where the variable-resistance material has not yet been subjected to application of an electric pulse after a film formation, applying an electric pulse having a first polarity at least once between first and second electrodes connected to the variable-resistance material such that the potential of the first electrode is higher than that of the second electrode; and
(b) uniquely determining a relationship between the polarity of the electric pulse to be applied between the first and second electrodes and the increase/decrease of the resistance value of the variable-resistance material, according to the polarity of the electric pulse applied in the step (a).

2. The memory device of claim 1, wherein information is recorded by the step of:
(c) changing the resistance value of the variable resistance material to a desired value by selecting the first polarity or a second polarity where the potential of the first electrode is lower than that of the second electrode, according to the relationship determined in the step (b), and applying an electric pulse having the selected polarity between the first and second electrodes to increase/decrease the resistance value of the variable-resistance material.

3. The memory device of claim 1, wherein in the step (a) the first electric pulse is repeatedly applied between the first and second electrodes until the variation rate of the resistance value of the variable-resistance material becomes smaller than a predetermined value.

4. The memory device of claim 3, wherein in the step (a) after the first electric pulse is repeatedly applied between the first and second electrodes until the variation rate of the resistance value of the variable-resistance material becomes smaller than a predetermined value, an electric pulse having the second polarity is applied at least once between the first and second electrodes connected to the variable-resistance material such that the potential of the first electrode is lower than that of the second electrode.

5. The memory device of claim 4, wherein in the step (a) the second electric pulse is repeatedly applied between the first and second electrodes until the variation rate of the resistance value of the variable-resistance material becomes smaller than a predetermined value.

6. A memory device comprising:
- a material (variable-resistance material) whose resistance value increases/decreases according to the polarity of an applied electric pulse,
- a first electrode and a second electrode connected to the variable-resistance material, and
- a fixed resistor, one end of which is connected to the first or second electrode, wherein the memory device is initialized by the steps of:
(a) in an initial state where the variable-resistance material has not yet been subjected to application of an electric pulse after a film formation, applying an electric pulse having a first polarity at least once between the first and second electrodes such that the potential of the first electrode is higher than that of the second electrode; and
(b) uniquely determining a relationship between the polarity of the electric pulse to be applied between the first and second electrodes and the increase/decrease of the resistance value of the variable-resistance material, according to the polarity of the electric pulse applied in the step (a).

7. The memory device of claim 6, wherein information is recorded by the step of:
(c) changing the resistance value of the variable-resistance material to a desired value by selecting the first polarity or a second polarity where the potential of the first electrode is lower than that of the second electrode, according to the relationship determined in the step (b), and applying an electric pulse having the selected polarity between the first and second electrodes to increase/decrease the resistance value of the variable-resistance material, thereby recording information in the variable-resistance material.

8. The memory device of claim 7, wherein memory information is read by the step of:
(d) reading memory information based on a voltage between the first and second electrodes which is obtained when a predetermined voltage is applied between one of the first and second electrodes which is not connected to the one end of the fixed resistor and the other end of the fixed resistor.

9. The memory device of claim 7, wherein memory information is read by the step of:
(d) reading memory information based on a voltage between the ends of the fixed resistor which is obtained when a predetermined voltage is applied between one of the first and second electrodes which is not connected to the one end of the fixed resistor and the other end of the fixed resistor.

* * * * *